US011940516B2

United States Patent
Liu et al.

(10) Patent No.: US 11,940,516 B2
(45) Date of Patent: Mar. 26, 2024

(54) SYSTEMS AND METHODS FOR MAGNETIC RESONANCE IMAGING

(71) Applicant: SHANGHAI UNITED IMAGING HEALTHCARE CO., LTD., Shanghai (CN)

(72) Inventors: Qi Liu, Houston, TX (US); Jingyuan Lyu, Houston, TX (US); Zhongqi Zhang, Houston, TX (US); Jian Xu, Houston, TX (US)

(73) Assignee: SHANGHAI UNITED IMAGING HEALTHCARE CO., LTD., Shanghai (CN)

( * ) Notice: Subject to any disclaimer, the term of this patent is extended or adjusted under 35 U.S.C. 154(b) by 72 days.

(21) Appl. No.: 17/649,360

(22) Filed: Jan. 29, 2022

(65) Prior Publication Data
US 2023/0243907 A1 Aug. 3, 2023

(51) Int. Cl.
  *G01R 33/48* (2006.01)
  *G01R 33/483* (2006.01)
  *G01R 33/50* (2006.01)
  *G01R 33/56* (2006.01)

(52) U.S. Cl.
  CPC ..... *G01R 33/4822* (2013.01); *G01R 33/4835* (2013.01); *G01R 33/50* (2013.01); *G01R 33/5608* (2013.01)

(58) Field of Classification Search
  None
  See application file for complete search history.

(56) References Cited

U.S. PATENT DOCUMENTS

| 8,742,757 | B2 | 6/2014 | Du |
| 10,436,871 | B2 | 10/2019 | Li et al. |
| 10,670,678 | B2 | 6/2020 | Beck |
| 2015/0327783 | A1 | 11/2015 | Wang et al. |
| 2022/0369948 | A1* | 11/2022 | Liu .................. A61B 5/0044 |
| 2022/0409084 | A1* | 12/2022 | Lyu .................. G01R 33/5616 |

FOREIGN PATENT DOCUMENTS

WO  2020061152 A1  3/2020

OTHER PUBLICATIONS

Jaime L. Shaw et al., Free-Breathing, Non-ECG, Continuous Myocardial T1 Mapping With Cardiovascular Magnetic Resonance Multitasking, Magnetic resonance in medicine, 81(4): 2450-2463, 2018.
Anthony G. Christodoulou et al., Magnetic Resonance Multitasking for Motion-Resolved Quantitative Cardiovascular Imaging, Nature Biomedical Engineering, 2(4): 215-226, 2018.
Wang, Nan et al., Six-dimensional quantitative DCE MR Multitasking of the entire abdomen: Method and application to pancreatic ductal adenocarcinoma, Magnetic resonance in medicine, 2019, 15 pages.

* cited by examiner

*Primary Examiner* — Rodney E Fuller
(74) *Attorney, Agent, or Firm* — METIS IP LLC

(57) ABSTRACT

A method for magnetic resonance imaging (MRI) may include obtaining imaging signals related to a region of interest (ROI) of a subject. The method may also include selecting a portion of the imaging signals as auxiliary signals associated with at least one temporal dimension of the ROI. The method may also include generating at least one target image associated with the at least one temporal dimension of the ROI based on the imaging signals and the auxiliary signals.

20 Claims, 9 Drawing Sheets

Time

SYSTEMS AND METHODS FOR MAGNETIC RESONANCE IMAGING

TECHNICAL FIELD

This disclosure generally relates to medical imaging, and more particularly, relates to systems and methods for magnetic resonance imaging (MRI).

BACKGROUND

The multitasking technique is capable of acquiring MRI data of multiple dimensions (e.g., information relating to various physiological motions, relaxations, etc.) in a single MRI scan. In some cases, navigation signals configured to determine temporal information for image reconstruction and image signals configured to determine spatial information for image reconstruction are acquired, which, however, leads to an increase in imaging time and lower imaging efficiency. Therefore, it is desirable to provide efficiency systems and methods for multitasking technique.

SUMMARY

According to an aspect of the present disclosure, a system for magnetic resonance imaging (MRI) may include one or more storage devices and one or more processors configured to communicate with the one or more storage devices. The one or more storage devices may include a set of instructions. When the one or more processors executing the set of instructions, the one or more processors may be directed to perform one or more of the following operations. The one or more processors may obtain imaging signals related to a region of interest (ROI) of a subject. The one or more processors may select a portion of the imaging signals as auxiliary signals associated with at least one temporal dimension of the ROI. The one or more processors may determine, based on the auxiliary signals, temporal information relating to at least one temporal dimension of the ROI. The one or more processors may generate at least one target image associated with the at least one temporal dimension of the ROI based on the imaging signals and the auxiliary signals.

According to another aspect of the present disclosure, a method for magnetic resonance imaging (MRI) may include one or more of the following operations. One or more processors may obtain obtain imaging signals related to a region of interest (ROI) of a subject. The one or more processors may select a portion of the imaging signals as auxiliary signals associated with at least one temporal dimension of the ROI. The one or more processors may determine, based on the auxiliary signals, temporal information relating to at least one temporal dimension of the ROI. The one or more processors may generate at least one target image associated with the at least one temporal dimension of the ROI based on the imaging signals and the auxiliary signals.

According to yet another aspect of the present disclosure, a system for magnetic resonance imaging (MRI) may include an obtaining module configured to obtain imaging signals related to a region of interest (ROI) of a subject. The system may also include a determination module configured to select a portion of the imaging signals as auxiliary signals associated with at least one temporal dimension of the ROI. The system may also include a reconstruction module configured to generate at least one target image associated with the at least one temporal dimension of the ROI based on the imaging signals and the auxiliary signals.

According to yet another aspect of the present disclosure, a non-transitory computer readable medium may comprise at least one set of instructions. The at least one set of instructions may be executed by one or more processors of a computer server. The one or more processors may obtain imaging signals related to a region of interest (ROI) of a subject. The one or more processors may select a portion of the imaging signals as auxiliary signals associated with at least one temporal dimension of the ROI. The one or more processors may determine, based on the auxiliary signals, temporal information relating to at least one temporal dimension of the ROI. The one or more processors may generate at least one target image associated with the at least one temporal dimension of the ROI based on the imaging signals and the auxiliary signals.

In some embodiments, the auxiliary signals may include the portion of the imaging signals sampled in a central region of k-space.

In some embodiments, the central region of k-space may include a k-space center line along a slice selection direction of k-space.

In some embodiments, the imaging signals may be acquired based on a plurality of k-space trajectories each of which passes through the central region.

In some embodiments, to select the portion of the imaging signals as the auxiliary signals associated with the ROI, the one or more processors may obtain a plurality of data sets each of which includes a portion of the plurality of k-space trajectories. In each of the plurality of data sets, the one or more processors may select, as an auxiliary subset, the imaging signals sampled in the central region. The one or more processors may designate the plurality of auxiliary subsets as the auxiliary signals.

In some embodiments, the k-space trajectories in each of the plurality of data sets may be sampled successively.

In some embodiments, for each of the plurality of data sets, the selected imaging signals in the corresponding auxiliary subset may be sampled at different locations in the central region.

In some embodiments, the imaging signals may be acquired in a plurality of parallel slices of k-space arranged along a slice-selective direction of k-space.

In some embodiments, the k-space trajectories in each of the plurality of parallel slices may pass through a center of the slice. The central region may pass through the centers of the plurality of parallel slices along the slice-selective direction.

In some embodiments, the k-space trajectories in each of the plurality of data sets may be radial trajectories that are from the plurality of parallel slices and corresponding to a same angle.

In some embodiments, to generate the at least one target image associated with the at least one temporal dimension of the ROI based on the imaging signals and the auxiliary signals, the one or more processors may determine, based on the auxiliary signals, temporal information relating to the at least one temporal dimension of the ROI. The one or more processors may determine, based on the temporal information and the imaging signals, spatial information relating to at least one spatial dimension of the ROI. The one or more processors may generate the at least one target image of the ROI based on the temporal information and the spatial information.

In some embodiments, the temporal information may include at least one temporal basis function relating to the at least one temporal dimension, and the spatial information may include at least one spatial basis function relating to the at least one spatial dimension.

In some embodiments, the at least temporal dimension may include at least one of a cardiac motion, a respiratory motion, a T1 relaxation, a T2 relaxation, a chemical exchange saturation transfer (CEST), a contrast agent dynamic, a T1ρ contrast, a molecular diffusion, or an elapsed time.

In some embodiments, to determine, based on the temporal information and the imaging signals, the spatial information relating to the spatial dimension of the ROI, the one or more processors may construct a target function based on the imaging signals and the temporal information. The one or more processors may determine estimated spatial information. The one or more processors may determine estimated imaging data based on the estimated spatial information and the temporal information. The one or more processors may determine a difference between the imaging signals and the estimated imaging data. The one or more processors may determine the spatial information by solving, based on the difference, the target function.

Additional features will be set forth in part in the description which follows, and in part will become apparent to those skilled in the art upon examination of the following and the accompanying drawings or may be learned by production or operation of the examples. The features of the present disclosure may be realized and attained by practice or use of various aspects of the methodologies, instrumentalities and combinations set forth in the detailed examples discussed below.

BRIEF DESCRIPTION OF THE DRAWINGS

The present disclosure is further described in terms of exemplary embodiments. These exemplary embodiments are described in detail with reference to the drawings. The drawings are not to scale. These embodiments are non-limiting exemplary embodiments, in which like reference numerals represent similar structures throughout the several views of the drawings, and wherein.

DETAILED DESCRIPTION

Figure 1:
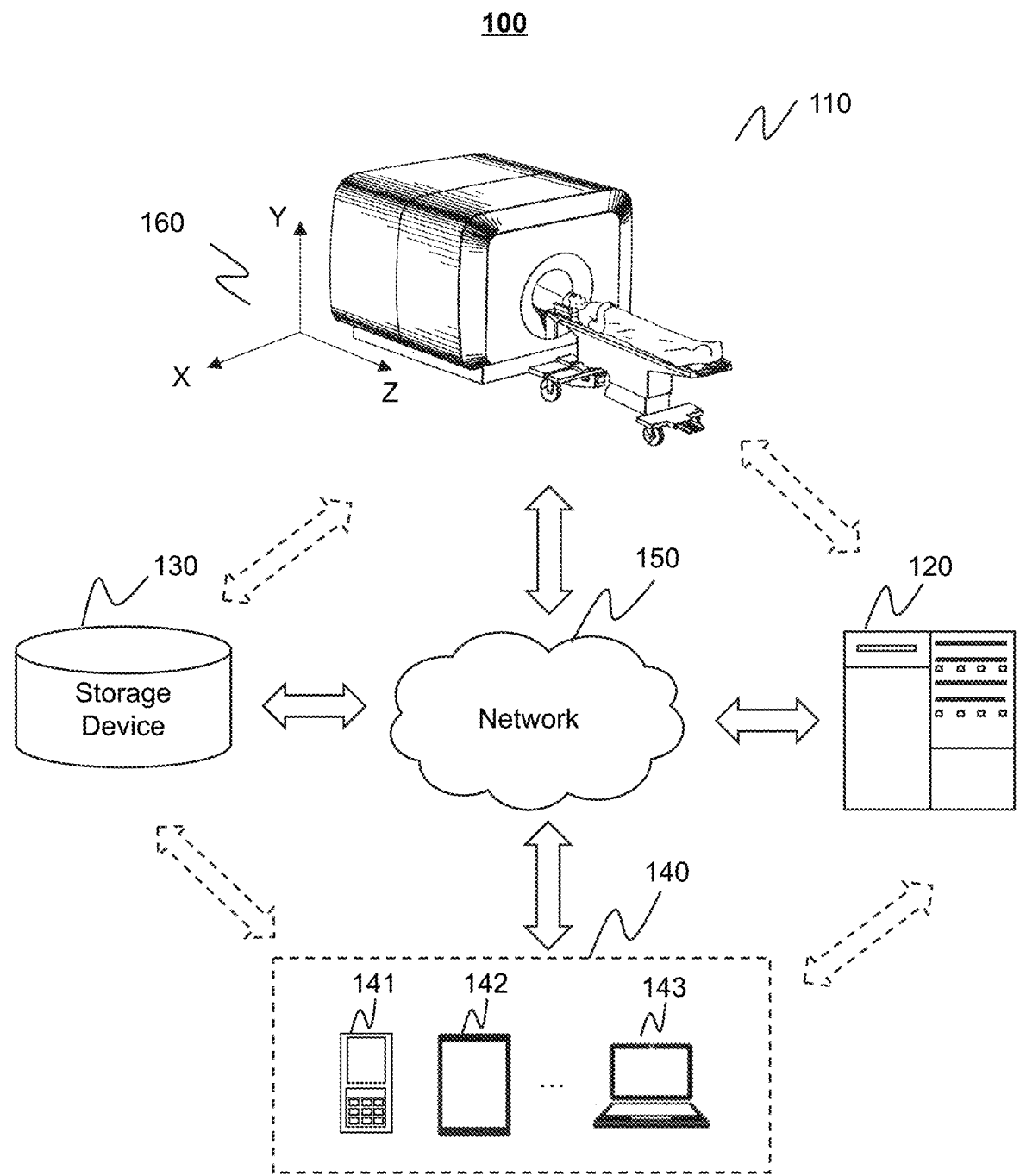
FIG. 1 is a schematic diagram illustrating an exemplary MRI system according to some embodiments of the present disclosure.

In the following detailed description, numerous specific details are set forth by way of examples in order to provide a thorough understanding of the relevant disclosure. However, it should be apparent to those skilled in the art that the present disclosure may be practiced without such details. In other instances, well-known methods, procedures, systems, components, and/or circuitry have been described at a relatively high-level, without detail, in order to avoid unnecessarily obscuring aspects of the present disclosure. Various modifications to the disclosed embodiments will be readily apparent to those skilled in the art, and the general principles defined herein may be applied to other embodiments and applications without departing from the spirit and scope of the present disclosure. Thus, the present disclosure is not limited to the embodiments shown, but to be accorded the widest scope consistent with the claims.

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof. Also, the term "exemplary" is intended to refer to an example or illustration.

It will be understood that the terms "system," "engine," "unit," "module," and/or "block" used herein are one method to distinguish different components, elements, parts, sections or assembly of different levels in ascending order. However, the terms may be displaced by another expression if they achieve the same purpose.

Generally, the word "module," "unit," or "block," as used herein, refers to logic embodied in hardware or firmware, or to a collection of software instructions. A module, a unit, or a block described herein may be implemented as software and/or hardware and may be stored in any type of non-transitory computer-readable medium or another storage device. In some embodiments, a software module/unit/block may be compiled and linked into an executable program. It will be appreciated that software modules can be callable from other modules/units/blocks or from themselves, and/or may be invoked in response to detected events or interrupts. Software modules/units/blocks configured for execution on computing devices may be provided on a computer-readable medium, such as a compact disc, a digital video disc, a flash drive, a magnetic disc, or any other tangible medium, or as a digital download (and can be originally stored in a compressed or installable format that needs installation, decompression, or decryption prior to execution). Such software code may be stored, partially or fully, on a storage device of the executing computing device, for execution by the computing device. Software instructions may be embedded in firmware, such as an EPROM. It will be further appreciated that hardware modules/units/blocks may be included in connected logic components, such as gates and flip-flops, and/or can be included of programmable units, such as programmable gate arrays or processors. The modules/units/ blocks or computing device functionality described herein may be implemented as software modules/units/blocks, but may be represented in hardware or firmware. In general, the modules/units/blocks described herein refer to logical modules/units/blocks that may be combined with other modules/ units/blocks or divided into sub-modules/sub-units/sub-blocks despite their physical organization or storage. The description may be applicable to a system, an engine, or a portion thereof.

It will be understood that, although the terms "first," "second," "third," etc., may be used herein to describe various elements, these elements should not be limited by these terms. These terms are only used to distinguish one element from another. For example, a first element could be termed a second element, and, similarly, a second element could be termed a first element, without departing from the scope of exemplary embodiments of the present disclosure.

The term "pixel" and "voxel" in the present disclosure are used interchangeably to refer to an element in an image. The term "image" in the present disclosure is used to refer to images of various forms, including a 2-dimensional image, a 3-dimensional image, a 4-dimensional image, etc.

Spatial and functional relationships between elements are described using various terms, including "connected," "attached," and "mounted." Unless explicitly described as being "direct," when a relationship between first and second elements is described in the present disclosure, that relationship includes a direct relationship where no other intervening elements are present between the first and second elements, and also an indirect relationship where one or more intervening elements are present (either spatially or functionally) between the first and second elements. In contrast, when an element is referred to as being "directly" connected, attached, or positioned to another element, there are no intervening elements present. Other words used to describe the relationship between elements should be interpreted in a like fashion (e.g., "between," versus "directly between," "adjacent," versus "directly adjacent," etc.).

These and other features, and characteristics of the present disclosure, as well as the methods of operation and functions of the related elements of structure and the combination of parts and economies of manufacture, may become more apparent upon consideration of the following description with reference to the accompanying drawings, all of which form a part of this disclosure. It is to be expressly understood, however, that the drawings are for the purpose of illustration and description only and are not intended to limit the scope of the present disclosure. It is understood that the drawings are not to scale.

These and other features, and characteristics of the present disclosure, as well as the methods of operation and functions of the related elements of structure and the combination of parts and economies of manufacture, may become more apparent upon consideration of the following description with reference to the accompanying drawings, all of which form a part of this disclosure. It is to be expressly understood, however, that the drawings are for the purpose of illustration and description only and are not intended to limit the scope of the present disclosure. It is understood that the drawings are not to scale.

The flowcharts used in the present disclosure illustrate operations that systems implement according to some embodiments of the present disclosure. It is to be expressly understood the operations of the flowcharts may be implemented not in order. Conversely, the operations may be implemented in inverted order, or simultaneously. Moreover, one or more other operations may be added to the flowcharts. One or more operations may be removed from the flowcharts.

Provided herein are systems and components for medical imaging and/or medical treatment. In some embodiments, the medical system may include an imaging system. The imaging system may include a single modality imaging system and/or a multi-modality imaging system. The single modality imaging system may include, for example, a magnetic resonance imaging (MRI) system. Exemplary MRI systems may include a superconducting magnetic resonance imaging system, a non-superconducting magnetic resonance imaging system, etc. The multi-modality imaging system may include, for example, a computed tomography-magnetic resonance imaging (MRI-CT) system, a positron emission tomography-magnetic resonance imaging (PET-MRI) system, a single photon emission computed tomography-magnetic resonance imaging (SPECT-MRI) system, a digital subtraction angiography-magnetic resonance imaging (DSA-MRI) system, etc. In some embodiments, the medical system may include a treatment system. The treatment system may include a treatment plan system (TPS), image-guide radiotherapy (IGRT), etc. The image-guide radiotherapy (IGRT) may include a treatment device and an imaging device. The treatment device may include a linear accelerator, a cyclotron, a synchrotron, etc., configured to perform a radio therapy on a subject. The treatment device may include an accelerator of species of particles including, for example, photons, electrons, protons, or heavy ions. The imaging device may include an MRI scanner, a CT scanner (e.g., cone beam computed tomography (CBCT) scanner), a digital radiology (DR) scanner, an electronic portal imaging device (EPID), etc.

An aspect of the present disclosure relates to systems and methods for MRI, more particular, to systems and methods for multitasking technique in MRI.

Imaging signals may be acquired based on a plurality of k-space trajectories each of which passes through a central region of 3D k-space, e.g., a k-space center line (e.g., Kx=Ky=0 in 3D k-space) along a slice selection direction of k-space. The systems and methods may obtain a plurality of data sets each of which includes a portion of the plurality of k-space trajectories sampled successively. In each of the plurality of data sets, the systems and methods may select, as an auxiliary subset, the imaging signals sampled in the central region. The systems and methods may designate the plurality of auxiliary subsets as the auxiliary signals. For each of the plurality of data sets, the selected imaging signals in the corresponding auxiliary subset may be sampled at different locations in the central region, so that a distribution of the selected imaging signals in k-space may cover the central region. The systems and methods may determine, based on the auxiliary signals, temporal information relating to at least one temporal dimension of the ROI. The systems and methods may determine, based on the auxiliary signals and the imaging signals, spatial information relating to at least one spatial dimension of the ROI. The systems and methods may generate at least one target image of the ROI based on the temporal information and the spatial information.

In some cases, auxiliary signals may be collected by sampling the same subset (e.g., same location or same region) of k-space repeatedly with a sampling frequency. For example, the auxiliary signals may correspond to one or more same k-space lines (e.g., the k-space center line of Ky=Kz=0 in 3D k-space) in k-space and be acquired by sampling the k-space line repeatedly with a sampling frequency.

In the present disclosure, each of the plurality of auxiliary subsets may correspond to the same region of k-space, for example, the k-space center line. Compared with the case in which auxiliary signals are collected by additionally sampling the k-space center line repeatedly with a sampling frequency, the time interval of the auxiliary subsets may correspond to the sampling frequency. Therefore, the auxiliary subsets selected from the imaging data may be used as auxiliary signals to determine temporal information for multitasking technique.

In the present disclosure, the auxiliary signals may be extracted from the imaging signals, instead of obtained by performing additional sampling, which reduces the imaging time and increases the efficiency of MRI.

FIG. 1 is a schematic diagram illustrating an exemplary MRI system according to some embodiments of the present disclosure. As illustrated, an MRI system 100 may include an MRI device 110, a processing device 120, a storage device 130, a terminal 140, and a network 150. The components of the MRI system 100 may be connected in one or more of various ways. Merely by way of example, as illustrated in FIG. 1, the MRI device 110 may be connected to the processing device 120 directly as indicated by the bi-directional arrow in dotted lines linking the MRI device 110 and the processing device 120, or through the network 150. As another example, the storage device 130 may be connected to the MRI device 110 directly as indicated by the bi-directional arrow in dotted lines linking the MRI device 110 and the storage device 130, or through the network 150. As still another example, the terminal 140 may be connected to the processing device 120 directly as indicated by the bi-directional arrow in dotted lines linking the terminal 140 and the processing device 120, or through the network 150.

The MRI device 110 may be configured to scan a subject (or a part of the subject) to acquire image data, such as echo signals (also referred to as magnetic resonance (MR) data or MR signals) associated with the subject. For example, the MRI device 110 may detect a plurality of echo signals by applying an MRI pulse sequence on the subject. In some embodiments, the MRI device 110 may include, for example, a main magnet, a gradient coil (or also referred to as a spatial encoding coil), a radio frequency (RF) coil, etc., as described in connection with FIG. 2. In some embodiments, the MRI device 110 may be a permanent magnet MRI scanner, a superconducting electromagnet MRI scanner, a resistive electromagnet MRI scanner, etc., according to types of the main magnet. In some embodiments, the MRI device 110 may be a high-field MRI scanner, a mid-field MRI scanner, a low-field MRI scanner, etc., according to the intensity of the magnetic field.

The subject scanned by the MRI device 110 may be biological or non-biological. For example, the subject may include a patient, a man-made object, etc. As another example, the subject may include a specific portion, an organ, tissue, and/or a physical point of the patient. Merely by way of example, the subject may include the head, the brain, the neck, a body, a shoulder, an arm, the thorax, the heart, the stomach, a blood vessel, soft tissue, a knee, a foot, or the like, or any combination thereof.

For illustration purposes, a coordinate system 160 including an X-axis, a Y-axis, and a Z-axis may be provided in FIG. 1. The X-axis and the Z axis shown in FIG. 1 may be horizontal, and the Y-axis may be vertical. As illustrated, the positive X direction along the X-axis may be from the right side to the left side of the MRI device 110 seen from the direction facing the front of the MRI device 110; the positive Y direction along the Y-axis shown in FIG. 1 may be from the lower part to the upper part of the MRI device 110; the positive Z direction along the Z-axis shown in FIG. 1 may refer to a direction in which the subject is moved out of a detection region (or referred to as a bore) of the MRI device 110.

In some embodiments, the MRI device 110 may be directed to select an anatomical region (e.g., a slice or a volume) of the subject along a slice selection direction and scan the anatomical region to acquire a plurality of echo signals from the anatomical region. During the scan, spatial encoding within the anatomical region may be implemented by spatial encoding coils (e.g., an X coil, a Y coil, a Z coil) along a frequency encoding direction, a phase encoding direction, and a slice selection direction. The echo signals may be sampled and the corresponding sampled data may be stored into a k-space matrix for image reconstruction. For illustration purposes, the slice selection direction herein may correspond to the Z direction defined by the coordinate system 160 and a Kz direction in k-space; the phase encoding direction may correspond to the Y direction defined by the coordinate system 160 and a Ky direction in k-space; and the frequency encoding direction (also referred to as readout direction) may correspond to the X direction defined by the coordinate system 160 and a Kx direction in k-space. It should be noted that the slice selection direction, the phase encoding direction, and the frequency encoding direction may be modified according to actual needs, and the modification may do not depart the scope of the present disclosure. More description of the MRI device 110 may be found elsewhere in the present disclosure. See, e.g., FIG. 2 and the description thereof.

The processing device 120 may process data and/or information obtained from the MRI device 110, the storage device 130, and/or the terminal(s) 140. For example, the processing device 120 may obtain imaging signals related to a region of interest (ROI) of a subject. The processing device 120 may select a portion of the imaging signals as auxiliary signals associated with the ROI. The processing device 120 may determine, based on the auxiliary signals, temporal information relating to at least one temporal dimension of the ROI. The processing device 120 may determine, based on the auxiliary signals and the imaging signals, spatial information relating to at least one spatial dimension of the ROI. The processing device 120 may generate at least one target image of the ROI based on the temporal information and the spatial information. In some embodiments, the processing device 120 may be a single server or a server group. The server group may be centralized or distributed. In some embodiments, the processing device 120 may be local or remote. For example, the processing device 120 may access information and/or data from the MRI device 110, the storage device 130, and/or the terminal(s) 140 via the network 150. As another example, the processing device 120 may be directly connected to the MRI device 110, the terminal(s) 140, and/or the storage device 130 to access information and/or data. In some embodiments, the processing device 120 may be implemented on a cloud platform. For example, the cloud platform may include a private cloud, a public cloud, a hybrid cloud, a community cloud, a distributed cloud, an inter-cloud, a multi-cloud, or the like, or a combination thereof. In some embodiments, the processing device 120 may be part of the terminal 140. In some embodiments, the processing device 120 may be part of the MRI device 110.

The storage device 130 may store data, instructions, and/or any other information. In some embodiments, the storage device 130 may store data obtained from the MRI device 110, the processing device 120, and/or the terminal(s) 140. The data may include image data acquired by the processing device 120, algorithms and/or models for processing the image data, etc. For example, the storage device 130 may store imaging signals obtained from an MRI device (e.g., the MRI device 110). As another example, the storage device 130 may store information of a coil sensitivity of each of a plurality of coils. As still another example, the storage device 130 may store a target image determined by the processing device 120. In some embodiments, the storage device 130 may store data and/or instructions that the processing device 120 and/or the terminal 140 may execute or use to perform exemplary methods described in the present disclosure. In some embodiments, the storage device 130 may include a mass storage, removable storage, a volatile read-and-write memory, a read-only memory (ROM), or the like, or any combination thereof. Exemplary mass storage may include a magnetic disk, an optical disk, a solid-state drive, etc. Exemplary removable storage may include a flash drive, a floppy disk, an optical disk, a memory card, a zip disk, a magnetic tape, etc. Exemplary volatile read-and-write memories may include a random-access memory (RAM). Exemplary RAM may include a dynamic RAM (DRAM), a double date rate synchronous dynamic RAM (DDR SDRAM), a static RAM (SRAM), a thyristor RAM (T-RAM), and a zero-capacitor RAM (Z-RAM), etc. Exemplary ROM may include a mask ROM (MROM), a programmable ROM (PROM), an erasable programmable ROM (EPROM), an electrically erasable programmable ROM (EEPROM), a compact disk ROM (CD-ROM), and a digital versatile disk ROM, etc. In some embodiments, the storage device 130 may be implemented on a cloud platform. Merely by way of example, the cloud platform may include a private cloud, a public cloud, a hybrid cloud, a community cloud, a distributed cloud, an inter-cloud, a multi-cloud, or the like, or any combination thereof.

In some embodiments, the storage device 130 may be connected to the network 150 to communicate with one or more other components in the MRI system 100 (e.g., the processing device 120, the terminal(s) 140). One or more components in the MRI system 100 may access the data or instructions stored in the storage device 130 via the network 150. In some embodiments, the storage device 130 may be integrated into the MRI device 110 or the processing device 120.

The terminal(s) 140 may be connected to and/or communicate with the MRI device 110, the processing device 120, and/or the storage device 130. In some embodiments, the terminal 140 may include a mobile device 141, a tablet computer 142, a laptop computer 143, or the like, or any combination thereof. For example, the mobile device 141 may include a mobile phone, a personal digital assistant (PDA), a gaming device, a navigation device, a point of sale (POS) device, a laptop, a tablet computer, a desktop, or the like, or any combination thereof. In some embodiments, the terminal 140 may include an input device, an output device, etc. The input device may include alphanumeric and other keys that may be input via a keyboard, a touchscreen (for example, with haptics or tactile feedback), a speech input, an eye tracking input, a brain monitoring system, or any other comparable input mechanism. Other types of the input device may include a cursor control device, such as a mouse, a trackball, or cursor direction keys, etc. The output device may include a display, a printer, or the like, or any combination thereof.

The network 150 may include any suitable network that can facilitate the exchange of information and/or data for the MRI system 100. In some embodiments, one or more components of the MRI system 100 (e.g., the MRI device 110, the processing device 120, the storage device 130, the terminal(s) 140, etc.) may communicate information and/or data with one or more other components of the MRI system 100 via the network 150. For example, the processing device 120 may obtain MR data from the MRI device 110 via the network 150. As another example, the processing device 120 and/or the terminal 140 may obtain information stored in the storage device 130 via the network 150. The network 150 may be and/or include a public network (e.g., the Internet), a private network (e.g., a local area network (LAN), a wide area network (WAN)), etc.), a wired network (e.g., an Ethernet network), a wireless network (e.g., an 802.11 network, a Wi-Fi network, etc.), a cellular network (e.g., a Long Term Evolution (LTE) network), a frame relay network, a virtual private network (VPN), a satellite network, a telephone network, routers, hubs, witches, server computers, and/or any combination thereof. For example, the network 150 may include a cable network, a wireline network, a fiber-optic network, a telecommunications network, an intranet, a wireless local area network (WLAN), a metropolitan area network (MAN), a public telephone switched network (PSTN), a Bluetooth™ network, a ZigBee™ network, a near field communication (NFC) network, or the like, or any combination thereof. In some embodiments, the network 150 may include one or more network access points. For example, the network 150 may include wired and/or wireless network access points such as base stations and/or internet exchange points through which one or more components of the MRI system 100 may be connected to the network 150 to exchange data and/or information.

This description is intended to be illustrative, and not to limit the scope of the present disclosure. Many alternatives, modifications, and variations will be apparent to those skilled in the art. The features, structures, methods, and other characteristics of the exemplary embodiments described herein may be combined in various ways to obtain additional and/or alternative exemplary embodiments. However, those variations and modifications do not depart the scope of the present disclosure. In some embodiments, the MRI system 100 may include one or more additional components and/or one or more components described above may be omitted. Additionally or alternatively, two or more components of the MRI system 100 may be integrated into a single component. For example, the processing device 120 may be integrated into the MRI device 110. As another example, a component of the MRI system 100 may be replaced by another component that can implement the functions of the component. As still another example, the processing device 120 and the terminal 140 may be integrated into a single device.

Figure 2:
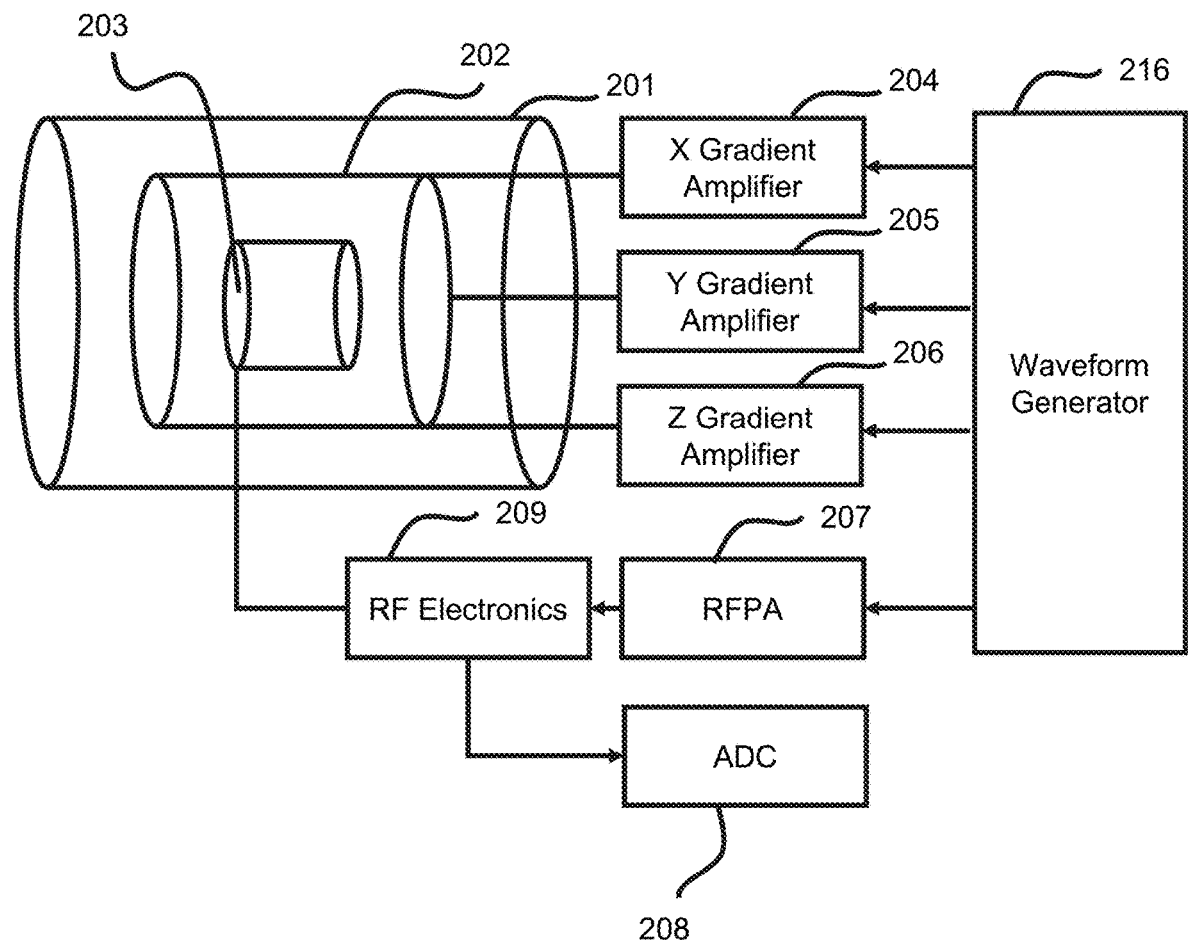
FIG. 2 is a schematic diagram illustrating an exemplary MRI device according to some embodiments of the present disclosure.

FIG. 2 is a schematic diagram illustrating an exemplary MRI device 110 according to some embodiments of the present disclosure. As illustrated, a main magnet 201 may generate a first magnetic field (or referred to as a main magnetic field) that may be applied to an object (also referred to as a subject) positioned inside the first magnetic field. The main magnet 201 may include a resistive magnet or a superconductive magnet that both need a power supply (not shown in FIG. 2) for operation. Alternatively, the main magnet 201 may include a permanent magnet. The main magnet 201 may form a detection region and surround, along the Z direction, the object that is moved into or positioned within the detection region. The main magnet 201 may also control the homogeneity of the generated main magnetic field. Some shim coils may be in the main magnet 201. The shim coils placed in the gap of the main magnet 201 may compensate for the inhomogeneity of the magnetic field of the main magnet 201. The shim coils may be energized by a shim power supply.

Gradient coils 202 may be located inside the main magnet 201. For example, the gradient coils 202 may be located in the detection region. The gradient coils 202 may surround, along the Z direction, the object that is moved into or positioned within the detection region. The gradient coils 202 may be surrounded by the main magnet 201 around the Z direction, and be closer to the object than the main magnet 201. The gradient coils 202 may generate a second magnetic field (or referred to as a gradient field, including gradient fields Gx, Gy, and Gz). The second magnetic field may be superimposed on the main magnetic field generated by the main magnet 201 and distort the main magnetic field so that the magnetic orientations of the protons of an object may vary as a function of their positions inside the gradient field, thereby encoding spatial information into MR signals generated by the region of the object being imaged. The gradient coils 202 may include X coils (e.g., configured to generate the gradient field Gx corresponding to the X direction), Y coils (e.g., configured to generate the gradient field Gy corresponding to the Y direction), and/or Z coils (e.g., configured to generate the gradient field Gz corresponding to the Z direction) (not shown in FIG. 2). In some embodiments, the Z coils may be designed based on circular (Maxwell) coils, while the X coils and the Y coils may be designed on the basis of the saddle (Golay) coil configuration. The three sets of coils may generate three different magnetic fields that are used for position encoding. The gradient coils 202 may allow spatial encoding of MR signals for image reconstruction. The gradient coils 202 may be connected with one or more of an X gradient amplifier 204, a Y gradient amplifier 205, or a Z gradient amplifier 206. One or more of the three amplifiers may be connected to a waveform generator 216. The waveform generator 216 may generate gradient waveforms that are applied to the X gradient amplifier 204, the Y gradient amplifier 205, and/or the Z gradient amplifier 206. An amplifier may amplify a waveform. An amplified waveform may be applied to one of the coils in the gradient coils 202 to generate a magnetic field in the X-axis, the Y-axis, or the Z-axis, respectively. The gradient coils 202 may be designed for either a close-bore MRI scanner or an open-bore MRI scanner. In some instances, all three sets of coils of the gradient coils 202 may be energized and three gradient fields may be generated thereby. In some embodiments of the present disclosure, the X coils and Y coils may be energized to generate the gradient fields in the X direction and the Y direction. As used herein, the X-axis, the Y-axis, the Z-axis, the X direction, the Y direction, and the Z direction in the description of FIG. 2 are the same as or similar to those described in FIG. 1.

In some embodiments, radio frequency (RF) coils 203 may be located inside the main magnet 201 and serve as transmitters, receivers, or both. For example, the RF coils 203 may be located in the detection region. The RF coils 203 may surround, along the Z direction, the object that is moved into or positioned within the detection region. The RF coils 203 may be surrounded by the main magnet 201 and/or the gradient coils 202 around the Z direction, and be closer to the object than the gradient coils 202. The RF coils 203 may be in connection with RF electronics 209 that may be configured or used as one or more integrated circuits (ICs) functioning as a waveform transmitter and/or a waveform receiver. The RF electronics 209 may be connected to a radiofrequency power amplifier (RFPA) 207 and an analog-to-digital converter (ADC) 208.

When used as transmitters, the RF coils 203 may generate RF signals that provide a third magnetic field that is utilized to generate MR signals related to the region of the object being imaged. The third magnetic field may be perpendicular to the main magnetic field. The waveform generator 216 may generate an RF pulse. The RF pulse may be amplified by the RFPA 207, processed by the RF electronics 209, and applied to the RF coils 203 to generate the RF signals in response to a powerful current generated by the RF electronics 209 based on the amplified RF pulse.

When used as receivers, the RF coils may be responsible for detecting MR signals (e.g., echoes). After excitation, the MR signals generated by the object may be sensed by the RF coils 203. The receive amplifier then may receive the sensed MR signals from the RF coils 203, amplify the sensed MR signals, and provide the amplified MR signals to the ADC 208. The ADC 208 may transform the MR signals from analog signals to digital signals. The digital MR signals then may be sent to the processing device 140 for sampling.

In some embodiments, the main magnet coil 201, the gradient coils 202, and the RF coils 203 may be circumferentially positioned with respect to the object around the Z direction. It is understood by those skilled in the art that the main magnet 201, the gradient coils 202, and the RF coils 203 may be situated in a variety of configurations around the object.

In some embodiments, the RFPA 207 may amplify an RF pulse (e.g., the power of the RF pulse, the voltage of the RF pulse) such that an amplified RF pulse is generated to drive the RF coils 203.

MRI systems (e.g., the MRI system 100 disclosed in the present disclosure) may be commonly used to obtain an interior image from a patient for a particular region of interest (ROI) that can be used for the purposes of, e.g., diagnosis, treatment, or the like, or a combination thereof. MRI systems include a main magnet (e.g., the main magnet 201) assembly for providing a strong uniform main magnetic field to align the individual magnetic moments of the H atoms within the patient's body. During this process, the H atoms oscillate around their magnetic poles at their characteristic Larmor frequency. If the tissue is subjected to an additional magnetic field, which is tuned to the Larmor frequency, the H atoms absorb additional energy, which rotates the net aligned moment of the H atoms. The additional magnetic field may be provided by an RF excitation signal (e.g., the RF signal generated by the RF coils 203). When the additional magnetic field is removed, the magnetic moments of the H atoms rotate back into alignment with the main magnetic field thereby emitting an echo signal. The echo signal is received and processed to form an MRI image. T1 relaxation may be the process by which the net magnetization grows/returns to its initial maximum value parallel to the main magnetic field. T1 may be the time constant for regrowth of longitudinal magnetization (e.g., along the main magnetic field). T2 relaxation may be the process by which the transverse components of magnetization decay or dephase. T2 may be the time constant for decay/dephasing of transverse magnetization.

If the main magnetic field is uniform across the entire body of the patient, then the RF excitation signal may excite all of the H atoms in the sample non-selectively. Accordingly, in order to image a particular portion of the patient's body, magnetic field gradients Gx, Gy, and Gz (e.g., generated by the gradient coils 202) in the X, Y, and Z directions, having a particular timing, frequency, and phase, may be superimposed on the uniform magnetic field such that the RF excitation signal excites the H atoms in a desired slice of the patient's body, and unique phase and frequency information is encoded in the echo signal depending on the location of the H atoms in the "image slice." Based on a gradient encoding, a Fourier imaging may be performed, in which measurements representing the spatial frequency of the subject, termed as k-space, can be acquired using a specific sampling trajectory. The specific sampling trajectory may include a Cartesian trajectory or a non-Cartesian trajectory such as a spiral trajectory, a radial trajectory, etc., and an image reconstruction is performed by applying an inverse Fourier transform (e.g., inverse fast Fourier transform) on k-space data.

Typically, portions of the patient's body to be imaged are scanned by a sequence of measurement cycles in which the RF excitation signals and the magnetic field gradients Gx, Gy and Gz vary according to an MRI imaging protocol that is being used. A protocol may be designed for one or more tissues to be imaged, diseases, and/or clinical scenarios. A protocol may include a certain number of pulse sequences oriented in different planes and/or with different parameters. The pulse sequences may include spin echo sequences, gradient echo sequences, diffusion sequences, inversion recovery sequences, or the like, or any combination thereof. For instance, the spin echo sequences may include a fast spin echo (FSE) pulse sequence, a turbo spin echo (TSE) pulse sequence, a rapid acquisition with relaxation enhancement (RARE) pulse sequence, a half-Fourier acquisition single-shot turbo spin-echo (HASTE) pulse sequence, a turbo gradient spin echo (TGSE) pulse sequence, or the like, or any combination thereof. As another example, the gradient echo sequences may include a balanced steady-state free precession (bSSFP) pulse sequence, a spoiled gradient echo (GRE) pulse sequence, and an echo planar imaging (EPI) pulse sequence, a steady state free precession (SSFP), or the like, or any combination thereof. For each MRI scan, the resulting echo signals may be digitized and processed to reconstruct an image in accordance with the MRI imaging protocol that is used.

Figure 3:
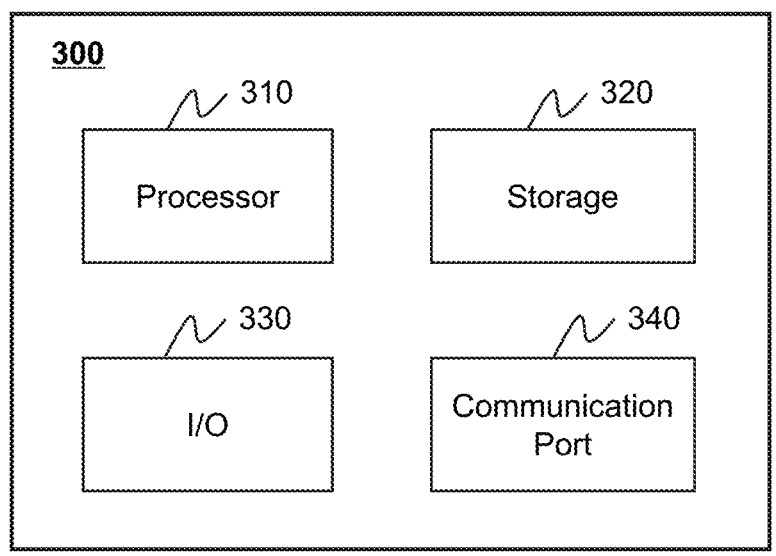
FIG. 3 is a schematic diagram illustrating exemplary hardware and/or software components of a computing device according to some embodiments of the present disclosure.

FIG. 3 is a schematic diagram illustrating exemplary hardware and/or software components of a computing device 300 according to some embodiments of the present disclosure. In some embodiments, one or more components of the MRI system 100 may be implemented on one or more components of the computing device 300. Merely by way of example, the processing device 120 and/or the terminal(s) 140 may be implemented one or more components of the computing device 300, respectively.

As illustrated in FIG. 3, the computing device 300 may include a processor 310, a storage device 320, an input/output (I/O) 330, and a communication port 340. The processor 310 may execute computer instructions (e.g., program code) and perform functions of the processing device 120 in accordance with techniques described herein. The computer instructions may include, for example, routines, programs, objects, components, data structures, procedures, modules, and functions, which perform particular functions described herein. For example, the processor 310 may process image data of a subject obtained from the MRI device 110, the storage device 130, terminal(s) 140, and/or any other component of the MRI system 100.

In some embodiments, the processor 310 may include one or more hardware processors, such as a microcontroller, a microprocessor, a reduced instruction set computer (RISC), an application specific integrated circuits (ASICs), an application-specific instruction-set processor (ASIP), a central processing unit (CPU), a graphics processing unit (GPU), a physics processing unit (PPU), a microcontroller unit, a digital signal processor (DSP), a field programmable gate array (FPGA), an advanced RISC machine (ARM), a programmable logic device (PLD), any circuit or processor capable of executing one or more functions, or the like, or a combinations thereof.

Merely for illustration, only one processor is described in the computing device 300. However, it should be noted that the computing device 300 in the present disclosure may also include multiple processors. Thus operations and/or method steps that are performed by one processor as described in the present disclosure may also be jointly or separately performed by the multiple processors. For example, if in the present disclosure the processor of the computing device 300 executes both operation A and operation B, it should be understood that operation A and operation B may also be performed by two or more different processors jointly or separately in the computing device 300 (e.g., a first processor executes operation A and a second processor executes operation B, or the first and second processors jointly execute operations A and B).

The storage device 320 may store data/information obtained from the MRI device 110, the storage device 130, the terminal(s) 140, and/or any other component of the MRI system 100. In some embodiments, the storage device 320 may include a mass storage device, a removable storage device, a volatile read-and-write memory, a read-only memory (ROM), or the like, or any combination thereof. For example, the mass storage device may include a magnetic disk, an optical disk, a solid-state drive, etc. The removable storage device may include a flash drive, a floppy disk, an optical disk, a memory card, a zip disk, a magnetic tape, etc. The volatile read-and-write memory may include a random-access memory (RAM). The RAM may include a dynamic RAM (DRAM), a double date rate synchronous dynamic RAM (DDR SDRAM), a static RAM (SRAM), a thyristor RAM (T-RAM), and a zero-capacitor RAM (Z-RAM), etc. The ROM may include a mask ROM (MROM), a programmable ROM (PROM), an erasable programmable ROM (EPROM), an electrically erasable programmable ROM (EEPROM), a compact disk ROM (CD-ROM), and a digital versatile disk ROM, etc. In some embodiments, the storage device 320 may store one or more programs and/or instructions to perform exemplary methods described in the present disclosure.

The I/O 330 may input and/or output signals, data, information, etc. In some embodiments, the I/O 330 may enable a user interaction with the computing device 300 (e.g., the processing device 120). In some embodiments, the I/O 330 may include an input device and an output device. Examples of the input device may include a keyboard, a mouse, a touch screen, a microphone, or the like, or any combination thereof. Examples of the output device may include a display device, a loudspeaker, a printer, a projector, or the like, or any combination thereof. Examples of the display device may include a liquid crystal display (LCD), a light-emitting diode (LED)-based display, a flat panel display, a curved screen, a television device, a cathode ray tube (CRT), a touch screen, or the like, or any combination thereof.

The communication port 340 may be connected to a network (e.g., the network 150) to facilitate data communications. The communication port 340 may establish connections between the computing device 300 (e.g., the processing device 120) and one or more components of the MRI system 100 (e.g., the MRI device 110, the storage device 130, and/or the terminal(s) 140). The connection may be a wired connection, a wireless connection, any other communication connection that can enable data transmission and/or reception, and/or a combination of these connections. The wired connection may include, for example, an electrical cable, an optical cable, a telephone wire, or the like, or a combination thereof. The wireless connection may include, for example, a Bluetooth™ link, a Wi-Fi™ link, a WiMax™ link, a WLAN link, a ZigBee link, a mobile network link (e.g., 3G, 4G, 5G, etc.), or the like, or any combination thereof. In some embodiments, the communication port 340 may be and/or include a standardized communication port, such as RS232, RS485, etc. In some embodiments, the communication port 340 may be a specially designed communication port. For example, the communication port 340 may be designed in accordance with the digital imaging and communications in medicine (DICOM) protocol.

Figure 4:
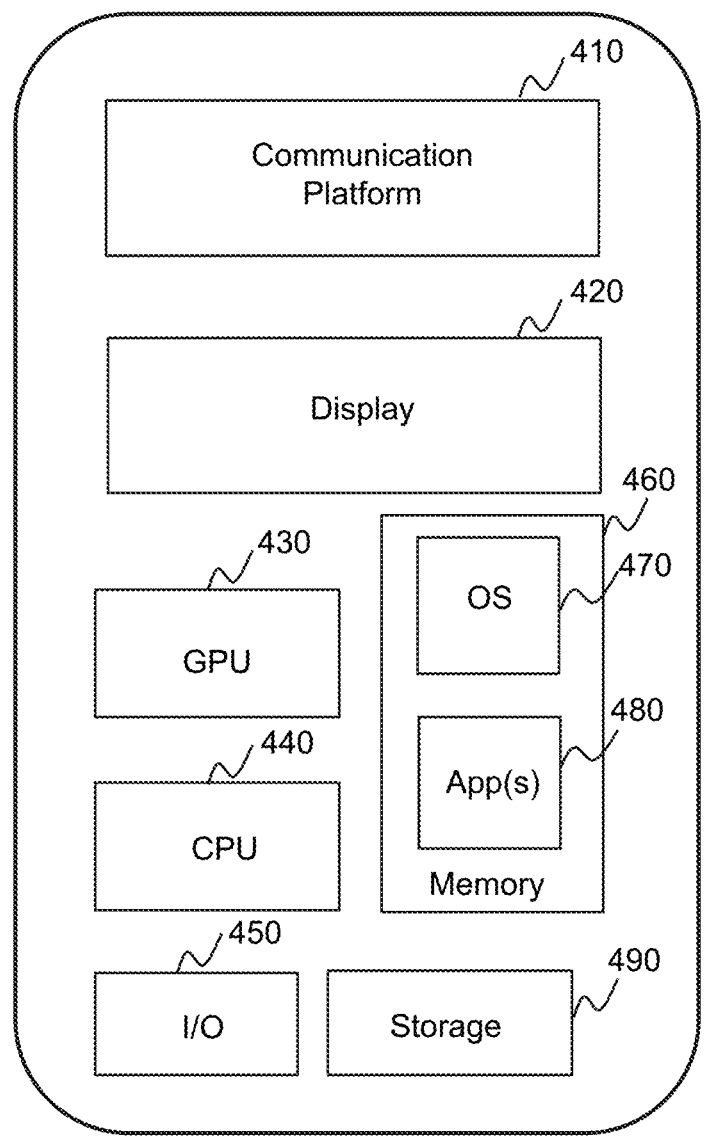
FIG. 4 is a schematic diagram illustrating exemplary hardware and/or software components of a mobile device may be implemented according to some embodiments of the present disclosure.

FIG. 4 is a schematic diagram illustrating exemplary hardware and/or software components of a mobile device 400 may be implemented according to some embodiments of the present disclosure. In some embodiments, one or more components of the MRI system 100 may be implemented on one or more components of the mobile device 400. Merely by way of example, the terminal 140 may be implemented on one or more components of the mobile device 400.

As illustrated in FIG. 4, the mobile device 400 may include a communication platform 410, a display 420, a graphics processing unit (GPU) 430, a central processing unit (CPU) 440, an I/O 450, a memory 460, and a storage 490. In some embodiments, any other suitable component, including but not limited to a system bus or a controller (not shown), may also be included in the mobile device 400. In some embodiments, a mobile operating system 470 (e.g., iOS™, Android™' Windows Phone™, etc.) and one or more applications 480 may be loaded into the memory 460 from the storage 490 in order to be executed by the CPU 440. The applications 480 may include a browser or any other suitable mobile apps for receiving and rendering information relating to the MRI system 100. User interactions with the information stream may be achieved via the I/O 450 and provided to the processing device 120 and/or other components of the MRI system 100 via the network 150.

To implement various modules, units, and their functionalities described in the present disclosure, computer hardware platforms may be used as the hardware platform(s) for one or more of the elements described herein. A computer with user interface elements may be used to implement a personal computer (PC) or any other type of work station or terminal. A computer may also act as a server if appropriately programmed.

Figure 5:
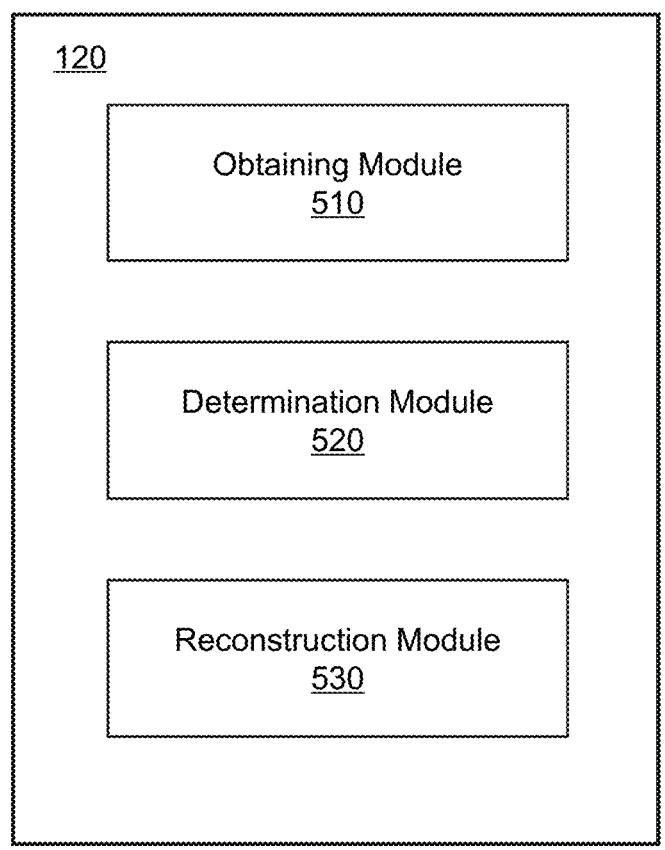
FIG. 5 is a schematic diagram illustrating an exemplary processing device according to some embodiments of the present disclosure.

FIG. 5 is a schematic diagram illustrating an exemplary processing device according to some embodiments of the present disclosure. In some embodiments, the processing device 120 may include an obtaining module 510, a determination module 520, and a reconstruction module 530. In some embodiments, the modules may be hardware circuits of all or part of the processing device 120. The modules may also be implemented as an application or set of instructions read and executed by the processing device 120. Further, the modules may be any combination of the hardware circuits and the application/instructions. For example, the modules may be part of the processing device 120 when the processing device 120 is executing the application/set of instructions.

The obtaining module 510 may be configured to obtain imaging signals related to a region of interest (ROI) of a subject.

The determination module 520 may be configured to select a portion of the imaging signals as auxiliary signals associated with the ROI.

The reconstruction module 530 may be configured to determine, based on the auxiliary signals, temporal information relating to at least one temporal dimension of the ROI.

The reconstruction module 530 may also be configured to determine, based on the temporal information and the imaging signals, spatial information relating to at least one spatial dimension of the ROI.

The reconstruction module 530 may also be configured to generate at least one target image of the ROI based on the temporal information and the spatial information.

It should be noted that the above description of the processing device 120 is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure. Two or more of the modules may be combined as a single module, and any one of the modules may be divided into two or more units. For example, the obtaining module 510 and the determination module 520 may be combined as a single module. As another example, the reconstruction module 530 may be divided into three units. A first unit may be configured to determine, based on the auxiliary signals, temporal information relating to at least one temporal dimension of the ROI. A second unit may be configured to determine, based on the auxiliary signals and the imaging signals, spatial information relating to at least one spatial dimension of the ROI. A third unit may be configured to generate at least one target image of the ROI based on the temporal information and the spatial information.

It should be noted that the above description is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure. For example, the processing device 120 may further include a storage module (not shown in FIG. 5). The storage module may be configured to store data generated during any process performed by any component of in the processing device 120. As another example, each of the components of the processing device 120 may include a storage device. Additionally or alternatively, the components of the processing device 120 may share a common storage device.

Figure 6:
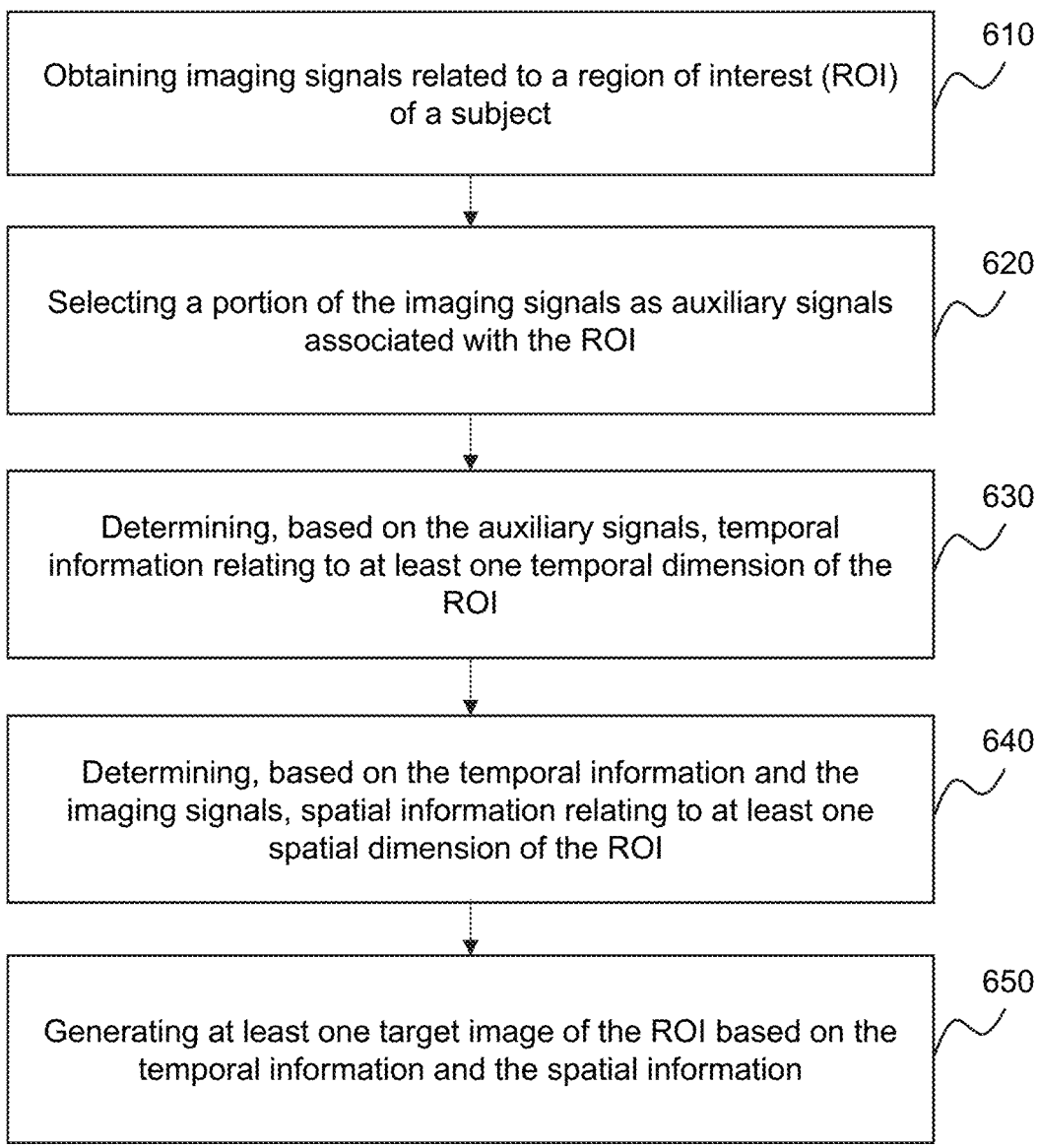
FIG. 6 is a flowchart illustrating an exemplary process for generating at least one target image according to some embodiments of the present disclosure.

FIG. 6 is a flowchart illustrating an exemplary process 600 for generating at least one target image according to some embodiments of the present disclosure. In some embodiments, the process 600 may be implemented in the MRI system 100 illustrated in FIG. 1. For example, the process 600 may be stored in the storage device 130 and/or the storage (e.g., the storage 320, the storage 490) as a form of instructions, and invoked and/or executed by the processing device 120 (e.g., the processor 310 of the computing device 300 as illustrated in FIG. 3, and/or one or more modules illustrated in FIG. 5). The operations of the illustrated process presented below are intended to be illustrative. In some embodiments, the process 600 may be accomplished with one or more additional operations not described, and/or without one or more of the operations discussed. Additionally, the order in which the operations of the process 600 as illustrated in FIG. 6 and described below is not intended to be limiting.

In 610, the processing device 120 (e.g., the obtaining module 510) may obtain imaging signals related to a region of interest (ROI) of a subject.

In some embodiments, the imaging signals may be acquired by applying a pulse sequence to the ROI. The imaging signals may be k-space data acquired by filling MR data (e.g., one or more echoes of the ROI) received by a plurality of receiving coils (e.g., the RF coils 203) of an MRI device (e.g., the MRI device 110) into k-space (e.g., 3D k-space) along a sampling pattern. The MR data may be generated based on the pulse sequence. In some embodiments, the ROI may include a slab or a volume of the subject for 3D imaging.

The imaging signals may include high-spatial resolution image data relating to at least one spatial-varying dimension (also referred to as spatial dimension) of the ROI of the subject. Exemplary spatial-varying dimensions may relate to a slice selection direction, a phase encoding direction, a frequency encoding direction, or the like, or any combination thereof. In some embodiments, the imaging signals may be used to determine spatial information including at least one spatial basis function relating to the at least one spatial-varying dimension of the ROI, which will be described in detail in connection with operation 640.

In some embodiments, the imaging signals may include three-dimensional (3D) k-space data, four-dimensional (4D) k-space data, or the like. As used herein, 4D k-space data refers to a data form containing 3D k-space data over time. Merely by way of example, the 3D imaging signals may be a 256*256*256 digital matrix.

In some embodiments, the imaging signals may be undersampled, fully sampled, or oversampled along at least one of the slice selection direction, the phase encoding direction, and the readout direction. In some embodiments, as used herein, the slice selection direction may correspond to a Kz direction in k-space and the Z direction defined by the coordinate system 160 in FIG. 1; the phase encoding direction may correspond to a Ky direction in k-space and the Y direction defined by the coordinate system 160 in FIG. 1; and the readout direction may correspond to a Kx direction in k-space and the X direction defined by the coordinate system 160 in FIG. 1.

In some embodiments, the sampling pattern may include a plurality of acquisition trajectories (also referred to as k-space trajectory). Exemplary acquisition trajectory may include a spiral trajectory, a radial trajectory, an oscillation trajectory, etc., or any combination thereof. In some embodiments, one of the plurality of acquisition trajectories may correspond to one or more echoes, e.g., the one or more echoes may be filled into k-space along the one of the plurality of acquisition trajectories. Merely by way of example, one echo may be filled into k-space along one acquisition trajectory.

In some embodiments, the imaging signals may be acquired based on a plurality of k-space trajectories each of which passes through a central region of k-space that is along the slice-selective direction of k-space. In some embodiments, the central region may be a k-space center line (e.g., a line of Kx=Ky=0) of 3D k-space. In some embodiments, the central region may be determined according to actual needs or experience. For example, taking the center point (e.g., a point of Kx=Ky=Kz=0 in 3D k-space) of k-space as the origin, the region (e.g., a spherical region in 3D k-space) of k-space in which the frequency value is from 0 to a threshold (e.g., 120 Hz, 130 Hz, etc.) may be determined as the central region. In some embodiments, a cylinder region in 3D k-space of k-space centered at the k-space center line may be determined as the central region.

In some embodiments, the imaging signals may be acquired based on a plurality of k-space trajectories each of which intersects with a k-space center line that is along the slice-selective direction of k-space.

In some embodiments, there may be one or more intersection points between a k-space trajectory and the k-space center line. Merely by way of example, one or more echoes may be filled into k-space along a k-space trajectory to generate the corresponding imaging signals. One of the corresponding imaging signals sampled at a location in the k-space center line may be referred to as an intersection point between the k-space trajectory and the k-space center line.

In some embodiments, the imaging signals may be acquired based on at least k-space trajectory parallel to the Kx-Ky plane of k-space, and/or at least one k-space trajectory at an angle with the Kx-Ky plane.

In some embodiments, the processing device 120 may obtain the imaging signals from one or more components (e.g., the MRI device 110, the terminal 140, and/or the storage device 130) of the MRI system 100 or an external storage device via the network 150. For example, the MRI device 110 may transmit the imaging signals to the storage device 130, or any other storage device for storage. The processing device 120 may obtain the imaging signals from the storage device 130, or any other storage device. As another example, the processing device 120 may obtain the imaging signals from the MRI device 110 directly.

In some embodiments, the pulse sequence may include a spin echo (SE) sequence, a gradient echo sequence, a diffusion sequence, an inversion recovery (IR) sequence, or the like, or any combination thereof. For instance, the spin echo sequence may include a fast spin echo (FSE) pulse sequence, a turbo spin echo (TSE) pulse sequence, a rapid acquisition with relaxation enhancement (RARE) pulse sequence, a half-Fourier acquisition single-shot turbo spin-echo (HASTE) pulse sequence, a turbo gradient spin echo (TGSE) pulse sequence, or the like, or any combination thereof. As another example, the gradient echo sequence may include a balanced steady-state free precession (bSSFP) pulse sequence, a spoiled gradient echo (GRE) pulse sequence, and an echo planar imaging (EPI) pulse sequence, a steady state free precession (SSFP), or the like, or any combination thereof.

In 620, the processing device 120 (e.g., the determination module 520) may select a portion of the imaging signals as auxiliary signals (also referred to as navigator signals or training signals) associated with the ROI.

In some embodiments, the auxiliary signals may include a portion of the imaging signals sampled in the central region of k-space. In some embodiments, for each of the plurality of k-space trajectories, the processing device 120 may select one or more imaging signals sampled in the central region. The selected imaging signals from the plurality of k-space trajectories may form the auxiliary signals.

In some embodiments, the auxiliary signals may include a portion of the imaging signals sampled in the k-space center line of k-space. In some embodiments, for each of the plurality of k-space trajectories, the processing device 120 may select one or more imaging signals (one or more intersection points between the k-space trajectory and the k-space center line) each of which is sampled at a location in the k-space center line.

In some embodiments, the processing device 120 may obtain a plurality of data sets each of which includes a portion of the plurality of k-space trajectories. In each of the plurality of data sets, the processing device 120 may select, as an auxiliary subset, the imaging signals sampled in the central region. For example, in each of the plurality of data sets, the processing device 120 may select, as an auxiliary line, the imaging signals sampled in the k-space center line. The processing device 120 may designate the plurality of auxiliary subsets as the auxiliary signals.

In some embodiments, the numbers (or counts) of k-space trajectories in each of the plurality of data sets may be the same or different.

In some embodiments, in each of the plurality of data sets, the k-space trajectories may be sampled successively, so that the plurality of data sets are acquired in time order, respectively. For example, one of the plurality of data sets may be acquired after or prior to another of the plurality of data sets.

In some embodiments, for each of the plurality of data sets, the selected imaging signals in the corresponding auxiliary subset may correspond to different locations in the central region, so that a distribution of the selected imaging signals in k-space may cover the central region. For example, for each of the plurality of data sets, the selected imaging signals in the corresponding auxiliary subset may correspond to different locations in the k-space center line, so that a distribution of the selected imaging signals in k-space may cover the k-space center line.

In some embodiments, the auxiliary signals may include high-temporal resolution data relating to at least one time-varying dimension (also referred to as temporal dimension) of the ROI of the subject, which may be used to implement the multitasking technique. Exemplary time-varying dimensions may relate to a cardiac motion, a respiratory motion, a T1 relaxation, a T2 relaxation, a chemical exchange saturation transfer (CEST), a contrast agent dynamic, a T1p contrast, a molecular diffusion, an elapsed time, or the like, or any combination thereof. It should be noted that the exemplary time-varying dimensions are merely provided for illustration purposes, and not intended to be limiting. The at least one time-varying dimension may include any dimension that reflects time-varying characteristics or dynamic information of the subject. In some embodiments, the auxiliary signals may be used to estimate temporal information including at least one temporal basis function relating to the at least one time-varying dimension, which will be described in detail in connection with operation 630.

In some cases, auxiliary signals may be collected by sampling the same subset (e.g., same location or same region) of k-space repeatedly with a sampling frequency. For example, the auxiliary signals may correspond to one or more same k-space lines (e.g., the k-space center line of Ky=Kz=0 in 3D k-space) in k-space and be acquired by sampling the k-space line repeatedly with a sampling frequency.

In the present disclosure, each of the plurality of auxiliary subsets may correspond to the same region of k-space, for example, the central region of k-space. In addition, the trajectories in each of the plurality of data sets are sampled successively over a period of time, so that the plurality of auxiliary subsets have a temporal resolution. The auxiliary subsets extracted from the imaging signals may approximate the data acquired by repeatedly sampling the same k-space subset. Therefore, the auxiliary subsets selected from the imaging signals may be used as auxiliary signals to determine temporal information for multitasking technique.

For example, in traditional data acquisition for multitasking technique, even though imaging signals include data sampled in a central region of 3D k-space, the portion of the imaging signals sampled in the central region of 3D k-space is not used as auxiliary signals to determine temporal information. Instead, additional sampling of the central region of k-space is repeatedly performed to acquire auxiliary signals. In the present disclosure, the portion of the imaging signals sampled in the central region of 3D k-space is involved in not only the determination of spatial information, but also the determination of temporal information in a role of auxiliary signals. Therefore, in the present disclosure, the additional operation for repeatedly sampling of the same subset of k-space to acquire auxiliary signals may be omitted, which may reduce the time and improve the efficiency of multitasking technique.

If an echo is generated in a TR, and the echo is filled into k-space as a k-space trajectory, the time interval of the auxiliary subsets may be TR*Ln (the number (or count) of k-space trajectories in a data set). Therefore, the auxiliary signals, including multiple auxiliary subsets, selected from the imaging signals may be with a time resolution, which can be used for temporal information determination in multitasking reconstruction. Compared with the case in which auxiliary signals are collected by additionally sampling the same subset of k-space repeatedly with a sampling frequency, the time interval of the auxiliary subsets may correspond to the sampling frequency.

In some embodiments, the time interval of the auxiliary subsets may be shorter than an interval threshold, so that the auxiliary signals is with a high-temporal resolution. The interval threshold may be a default value, or determined manual by a user, or determined by the processing device 120 according to data analysis. For example, the interval threshold may be determined according to the at least one time-varying dimension to be analyzed. Merely by way of example, a time-varying dimension may relate to the respiratory motion of the subject, and the respiration cycle of the subject is close to 0.75 seconds (s). In order to capture dynamic information relating to the respiratory motion of the subject, the time interval of the auxiliary lines may need to be shorter than an interval threshold of 0.75 s. As another example, the interval threshold may be determined according to actual requirements (e.g., the accuracy requirement), experience, a data model, etc.

In some embodiments, the time interval of the auxiliary subsets may be determined by adjusting the acquisition of the imaging signals, e.g., the length of TR, the number (or count) of echoes sampled in a TR, the number (or count) of k-space trajectories in each of the plurality of data sets, or the like, or any combination thereof.

In 630, the processing device 120 (e.g., the reconstruction module 530) may determine, based on the auxiliary signals, temporal information relating to at least one temporal dimension of the ROI.

In some embodiments, a target image of the ROI with multiple dimensions (e.g., at least one spatial-varying dimension and at least one time-varying dimension) may be represented by a multi-dimensional tensor. For example, the target image may be represented as an (N+1)-way image tensor (or array), wherein the first tensor dimension may index the at least one spatial-varying dimension and each of the other N tensor dimension(s) may index a time-varying dimension. N is a positive integer and equal to the count of the time-varying dimension(s).

A low-rank tensor image model may be used to resolve multiple overlapping dynamics (e.g., the at least one time-varying dimension). For example, according to the low-rank tensor image model, the target image may be expressed by a product of a core tensor and (N+1) basis matrices. The core tensor may govern the interaction between the (N+1) basis matrices. The (N+1) basis matrices may include a spatial factor matrix and N temporal factor matrix (or matrices). The spatial factor matrix may include one or more spatial basis functions relating to the at least one spatial-varying dimension of the ROI. Each of the N temporal factor matrix (or matrices) may correspond to one of the at least one time-varying dimension and include one or more temporal basis functions relating to the corresponding time-varying dimension. In order to generate the target image, the at least one spatial basis function, the at least one temporal basis function, and the core tensor may need to be determined based on the auxiliary signals and the imaging signals.

In some embodiments, the temporal information may include one or more temporal basis functions relating to the at least one time-varying dimension. For example, the one or more temporal basis functions may include one or more cardiac temporal basis functions relating to the cardiac motion of the ROI, one or more respiratory temporal basis functions relating to the respiratory motion of the ROI, one or more T1 recovery temporal basis functions relating to the T1 relaxation of the ROI, or the like, or any combination thereof. A temporal basis function relating to a time-varying dimension may reflect dynamic information along the time-varying dimension and include high-temporal resolution information.

In some embodiments, the processing device 120 may determine the one or more temporal basis functions of the one or more time-varying dimensions and the core tensor based on the auxiliary signals obtained in operation 620.

As illustrated in operation 620, the auxiliary signals may include a plurality of auxiliary lines corresponding to a same subset (e.g., the central region) of k-space but different sampling time. Therefore, the auxiliary signals may correspond to a partially encoded image relating to the one or more time-varying dimensions of the ROI. Therefore, the auxiliary signals may include the temporal information of the ROI, and the temporal information may be extracted from the auxiliary signals.

For example, the processing device 120 may construct a first optimization function (also referred to as a first objective function or a first target function) relating to under-sampled auxiliary data (e.g., the auxiliary signals obtained in operation 620), a low-rank tensor representing full-sampled auxiliary signals to be determined, and a matrix corresponding to each time-varying dimension. The matrix corresponding to a time-varying dimension may include rows indexing the time-varying dimension and columns indexing the other time-varying dimension(s). The processing device 120 may determine the low-rank tensor representing the full-sampled auxiliary signals by solving the first optimization function.

According to the low-rank tensor, the processing device 120 may determine the at least one temporal basis function for each time-varying dimension and the core tensor. The low-rank tensor may be decomposed into a partially encoded spatial factor matrix, a core tensor, and one or more temporal basis matrices. For example, the processing device 120 may utilize an explicit strategy to recover the one or more temporal basis functions and the core tensor based on the low-rank tensor according to a singular value decomposition (SVD) algorithm or a higher order singular value decomposition (HOSVD) algorithm.

In 640, the processing device 120 (e.g., the reconstruction module 530) may determine, based on the temporal information and the imaging signals, spatial information relating to at least one spatial dimension of the ROI.

In some embodiments, the spatial information may include a spatial factor matrix that includes one or more spatial basis functions relating to the at least one spatial-varying dimension of the ROI.

A spatial basis function may include high-spatial resolution information along the spatial-varying dimension(s). For example, the spatial basis function may reflect a relationship between pixel information of the ROI in the image domain and spatial information of the ROI in the physical domain. In some embodiments, the spatial basis function may be represented as a basis image that includes high-spatial resolution information. Different spatial basis functions may be represented as basis images that include different high-spatial resolution information.

In some embodiments, the processing device 120 may construct a second optimization function (also referred to as a second objective function or a second target function) relating to the at least one spatial basis function. In some embodiments, the second optimization function may incorporate the imaging signals, the point spread function, and the time information. The processing device 120 may further determine the spatial information by solving the second optimization function.

In some embodiments, the processing device 120 may determine estimated spatial information. The processing device 120 may determine estimated imaging data based on the estimated spatial information, the point spread function, and the temporal information. The processing device 120 may determine a difference between the plurality of imaging signals and the estimated imaging data. The processing device 120 may determine the spatial information by solving, based on the difference, the second optimization function.

In some embodiments, the second optimization function may be solved by minimizing the difference to obtain a satisfactory condition, for example, the difference is less than a threshold. In some embodiments, the second optimization function may be solved using multiple iterations. For example, in the current iteration, in response to determining that the difference is less than the threshold, the estimated spatial information corresponding to the current iteration may be used as the spatial information of the ROI. In response to determining that the difference is not less than the threshold, new estimated spatial information may be obtained to initiate a new iteration.

In some embodiments, the second optimization function may include a comparison item configured to limit the difference between the plurality of imaging signals and the estimated imaging data.

In some embodiments, the second optimization function may further include a regularization item configured to limit the estimated spatial information. The regular term may be configured to stabilize the estimated spatial information. For example, the regular term may make the estimated spatial information obtained in the multiple iterations not fluctuate too much, which causes the spatial information finally obtained accurate. In some embodiments, the regularization term may be determined based on the estimated spatial information. For example, the L1 norm of a coefficient determined by performing wavelet transformation on the estimated spatial information may be used as the regularization term. As another example, the total variation of the spatial dimension of the estimated spatial information may be used as the regularization term. As still another example, other regularization algorithms, such as Bayesian algorithm, etc., may also be used to obtain the regularization term. In some embodiments, the regularization item may be omitted.

Merely by way of example, the processing device 120 may determine the spatial information of the ROI according to a second optimization function shown in Equation (1) as below:

$$\hat{U} = \underset{U_x}{\mathrm{argmin}} \|d - \Omega(FSU_x\Phi)\|_2^2 + R(U_x), \quad (1)$$

where $\hat{U}$ represents an optimal spatial factor matrix (e.g., the spatial information to be determined) of the ROI determined by solving Equation (4), $U_x$ represents estimated spatial factor matrix (e.g., the estimated spatial information) of the ROI, d represents the imaging signals, $\Omega$ represents an undersampling operator corresponding to the imaging signals, F represents a Fourier transformation operator, S represents a coil sensitive map corresponding to the ROI, $\Phi$ represents a product of the core tensor and the one or more temporal factor matrices, $R(U_x)$ represents a regularization item that is a constraint item relating to the spatial factor matrix of the ROI (which may be omitted in some conditions). In some embodiments, the comparison item of Equation (4) may include $$\underset{U_x}{\mathrm{argmin}} \|d - \Omega(FSU_x\Phi)\|_2^2.$$

In some embodiments, the processing device 120 may determine estimated imaging data based on $\Omega(FSU_x\Phi)$ in Equation (1).

In some embodiments, the coil sensitive map may indicate a plurality of coil sensitivities of a plurality of receiving coils of the MRI device 110.

In some embodiments, the processing device 120 (e.g., the obtaining module 510) may obtain a coil sensitivity of each of the plurality of receiving coils. In some embodiments, a receiving coil may correspond to a coil sensitivity. As used herein, the coil sensitivity of a receiving coil refers to a response degree of the receiving coil for receiving an input signal (e.g., an MR signal). In some embodiments, the coil sensitivity of a receiving coil may represent a spatial brightness change and/or a phase change introduced when an image is obtained by the receiving coil. In some embodiments, the coil sensitivity may be a complex number, and the modulus of the complex number may be between 0 and 1. In some embodiments, the coil sensitivity of the each receiving coil of the plurality of receiving coils in the MRI device may be the same or different.

In some embodiments, the coil sensitivity of the receiving coil may be determined based on a coil sensitivity algorithm. Exemplary coil sensitivity algorithms may include a sum of squares (SOS) algorithm, an estimating signal parameters via rotational invariance technique (ESPIRiT)-based algorithm, or the like.

In some embodiments, the processing device 120 may obtain the coil sensitivity map from one or more components (e.g., the MRI device 110, the terminal 140, and/or the storage device 130) of the MRI system 100 or an external storage device via the network 150. For example, the plurality of coil sensitivities of the plurality of receiving coils may be stored in the storage device 130, or any other storage device for storage. The processing device 120 may obtain the plurality of coil sensitivities of the plurality of receiving coils from the storage device 130, or any other storage device.

In 650, the processing device 120 (e.g., the reconstruction module 530) may generate one or more target images of the ROI based on the temporal information and the spatial information.

A target image of the ROI may be a static image and/or a dynamic image of the ROI. In some embodiments, the static image may correspond to a specific motion phase of the ROI. For example, the static image may include a 2D or 3D image of the ROI corresponding to a certain cardiac phase or a certain respiratory phase. The dynamic image may reflect dynamic information of the ROI along at least one time-varying dimension. In some embodiments, the dynamic image may include a series of 2D or 3D images over time, such as a plurality of 2D or 3D images of the ROI corresponding to a plurality of motion phases of the subject. For example, a dynamic image may reflect the cardiac motion of a cardiac slice or volume over a cardiac cycle, and include a plurality of images of the cardiac slice or volume corresponding to a plurality of cardiac phases in the cardiac cycle.

In some embodiments, the processing device 120 may generate a plurality of 3D static images of the ROI corresponding to at least one temporal dimension, and further generate a 4D dynamic image of the ROI corresponding to the at least one temporal dimension by combining the plurality of 3D static images of the ROI.

In some embodiments, the processing device 120 may generate a plurality of 2D static images of each slice of the ROI. The plurality of 2D static images may correspond to at least one temporal dimension. The processing device 120 may further generate a 3D dynamic image of the ROI corresponding to the at least one temporal dimension by combining the plurality of 2D static images of the slices of the ROI.

In some embodiments, the processing device 120 may generate a dynamic image corresponding to at least one temporal dimension for each slice of the ROI, and further generate a 3D dynamic image of the ROI by combining the dynamic images of the slices of the ROI.

As aforementioned, a target image of the ROI with multiple dimensions may be represented by a multi-dimensional tensor, which may be determined based on the spatial information (e.g., a spatial factor matrix including one or more spatial basis functions) of the ROI, the temporal information (e.g., one or more temporal factor matrices including one or more temporal basis functions) of the ROI, and the core tensor. For example, with the core tensor, the spatial information, and the temporal information available, the processing device 120 may generate the target image of the ROI with multiple time-varying dimensions by determining a product of the one or more temporal factor matrices of the one or more time-varying dimensions including the one or more temporal basis functions, the spatial factor matrix including the one or more spatial basis functions, and the core tensor that governs the interaction between the temporal factor matrices and the spatial factor matrix, e.g., determining a product of the spatial information, the temporal information, and the core tensor, i.e., the processing device 120 may generate the target image by performing multiplication of the spatial information, the temporal information, and the core tensor.

In some embodiments, the processing device 120 may generate a target image of the ROI corresponding to a certain time-varying dimension based on the temporal factor matrix corresponding to the certain time-varying dimension and the spatial factor matrix including the at least one spatial basis function. For example, the processing device 120 may generate a dynamic image of the ROI by determining a product of a spatial factor matrix including the spatial basis function(s) of the ROI, the temporal factor matrix including the temporal basis function(s) relating to the cardiac motion, and a core tensor that governs the interaction between the spatial factor matrix and the temporal factor matrix. As another example, the processing device 120 may further extract a static image of the ROI corresponding to a certain cardiac phase from the dynamic image of the ROI.

It should be noted that the above description regarding the process 600 is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure. In some embodiments, the process 600 may be accomplished with one or more additional operations not described and/or without one or more of the operations discussed above. In some embodiments, the Equations provided above are illustrative examples and can be modified in various ways. For example, one or more coefficients in an Equation may be omitted, and/or the Equation may further include one or more additional coefficients.

Figure 7:
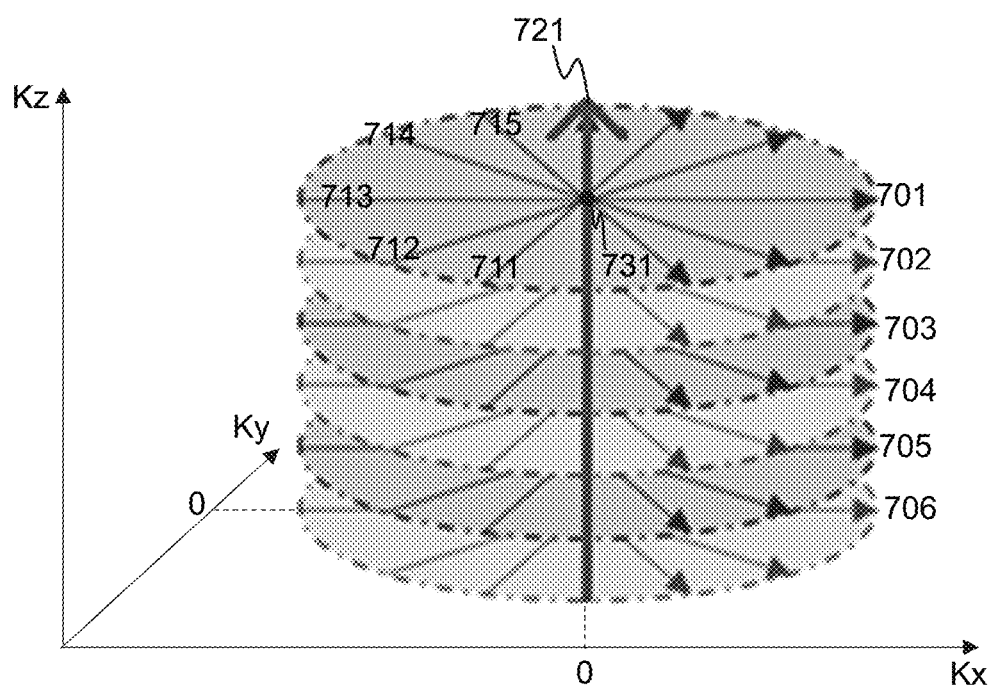
FIG. 7 is a schematic diagram of an exemplary sampling pattern of imaging signals according to some embodiments of the present disclosure.

FIG. 7 is a schematic diagram of an exemplary sampling pattern of imaging signals according to some embodiments of the present disclosure. In FIG. 7, Kx, Ky, and Kz correspond to the readout direction, the phase-encoding direction, and the slice selection direction of k-space, respectively, and correspond to the X-axis, Y-axis, and Z-axis in FIG. 1.

In some embodiments, the imaging signals may be acquired at a plurality of parallel slices arranged along the slice-selective direction.

In some embodiments, the imaging signals may be acquired using a 3D stack acquisition. In some embodiments, a slice selection gradient may be applied to the ROI along the slice selection direction to partition 3D k-space into a plurality of parallel regions (e.g., Kx-Ky planes) along the slice-selective direction, which enables Cartesian encoding along the slice selection direction.

In some embodiments, data sampling may be performed in each of the plurality of parallel slices along a plurality of k-space trajectories each of which passes through the center of the single slice. The central region of k-space may pass through the centers of the plurality of parallel slices of k-space. For example, if the central region of k-space is the k-space center line, the center of a single slice may be a point of Kx=Ky=0 in the slice. As another example, if the central region of k-space is a cylinder region centered at the k-space center line, the center of a single slice may be a circle region centered at the point of Kx=Ky=0 in the slice.

In some embodiments, the plurality of parallel slices may correspond to same or different k-space trajectories. For example, data sampling may be performed in each of the plurality of parallel slices along a plurality of radial trajectories each of which has a specific angle and passes through the center of the single slice. The angles and the number (or count) of the radial trajectories in each of the plurality of parallel slices may be the same.

Merely by way of example, as shown in FIG. 7, the imaging signals may be acquired in parallel slices 701-706 arranged in different locations along the slice selection direction. In the slices 701-706, the imaging signals may be acquired as radial k-space trajectories, e.g., radial trajectories 711-715 in slice 701. In the slice selection direction (e.g. the Kz direction) Cartesian encoding may be performed, while the imaging signals may be acquired within each single slice along radial trajectories that pass through the center (Kx=Ky=0), e.g., 731 in slice 701. As shown in FIG. 7, slice 701 may correspond to 5 radial trajectories 711-715. Each of slices 702-706 may also correspond to 5 radial trajectories with the same angles as radial trajectories 711-715, respectively.

A data set may include one or more radial trajectories of each slice. These radial trajectories may be sampled successively but in any order. In some embodiments, the sampling sequence of the radial trajectories in the data set may be sequentially along the positive z or negative z direction. For example, along the negative z direction, a radial trajectory in slice 701 is first sampled, then a radial trajectory in slice 702 is sampled, and so on, and a radial trajectory in slice 706 is finally sampled. As another example, along the positive z direction, a radial trajectory in slice 706 is first sampled, then a radial trajectory in slice 705 is sampled, and so on, and a radial trajectory in slice 701 is finally sampled. In some embodiments, the sampling sequence of the radial trajectories in the data set may be performed from the center slice to the k-space periphery. For example, a radial trajectory in slice 703 is first sampled, then a trajectory in slice 704 is sampled, then a radial trajectory in slice 702 is sampled, then a radial trajectory in slice 705 is sampled, then a radial trajectory in slice 701 is sampled, and a radial trajectory in slice 706 is finally sampled.

In some embodiments, the sampling sequences of the radial trajectories in different data sets may be the same or different. For example, the sampling sequence of the radial trajectories in a first data set may be sequentially along the positive z or negative z direction, and the sampling sequence of the radial trajectories in a second data set may be performed from the center slice to the k-space periphery.

In some embodiments, the radial trajectories in the data set may be the same or different. For example, taking FIG. 7 as an example, the data set may include radial trajectory 711 in slice 701, and radial trajectories with the same angle as radial trajectory 711 in slices 702-706, respectively.

In some embodiments, in a data set, the processing device 120 may select, as an auxiliary subset, the imaging signals sampled at the center of each of slices 701-706. In some embodiments, the selected imaging signals may be sampled at different locations in the center of each slice so that the distribution of the selected imaging signals in k-space may cover the central region of k-space, e.g., the k-space center line 721.

It should be noted that the above description is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure.

Figure 8:
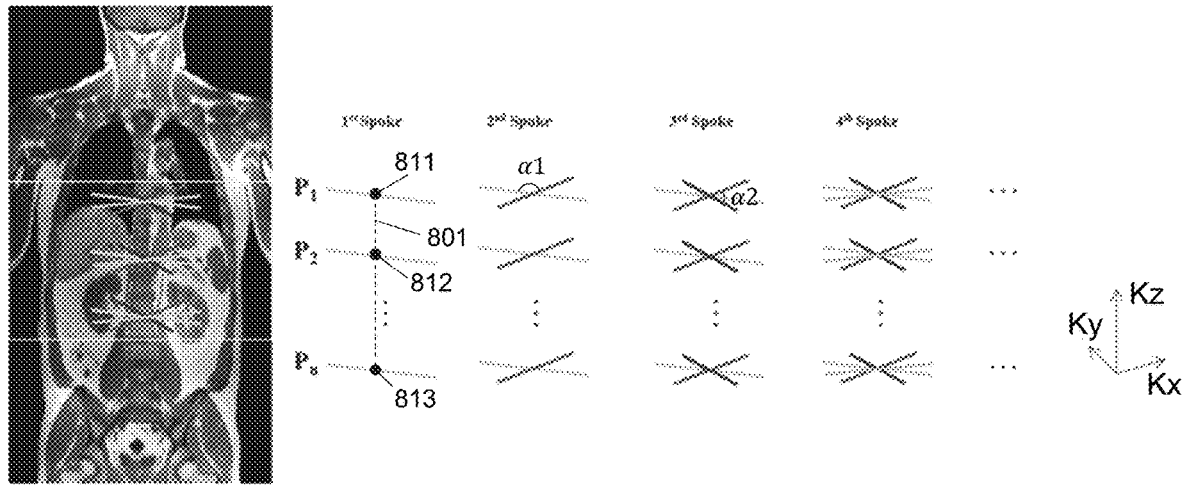
FIG. 8 is a schematic diagram of an exemplary sampling sequence of imaging signals according to some embodiments of the present disclosure.

FIG. 8 is a schematic diagram of an exemplary sampling sequence of imaging signals according to some embodiments of the present disclosure. Kx, Ky, and Kz in FIG. 8 correspond to Kx, Ky, and Kz in FIG. 7.

As shown in FIG. 8, the imaging signals may be acquired using 3D stack acquisition. The imaging signals may be acquired from n parallel slices $P_1$-$P_n$. In each slice, the imaging signals may be acquired as multiple radial trajectories (also referred to as spokes) passing through the center (Kx=Ky=0) of the slice.

As shown in FIG. 8, in the acquisition process of the imaging signals, firstly, first spokes corresponding to a first angle in slices $P_1$-$P_n$ may be sampled successively in any order to form a first data set. Then, second spokes corresponding to a second angle in slices $P_1$-$P_n$ may be sampled successively in any order to form a second data set, and so on.

In some embodiments, the spoke angle may be varied each time by any value, such as 105.44 degrees, 111.25 degrees, and 180 degrees/$n_{total}$ (the total number of spokes in a slice). In some embodiments, the variation of the spoke angle each time may be the same or different. For example, as shown in FIG. 8, the angle difference between the first spokes and the second spokes may be α1, and the angle difference between the second spokes and the third spokes may be α2, wherein α1 may be the same as or different from α2.

As shown in FIG. 8, for a data set, the spokes corresponding to a certain angle of slices $P_1$-$P_n$ are arranged in k-space into a plane that is parallel to the slice selection direction and passes through the k-space center line 801. The imaging signals (e.g., signals 811-813 in FIG. 8) sampled in the k-space center line 801 may be selected from the data set to form an auxiliary subset (e.g., auxiliary line data along the slice selection direction).

If an echo is generated in a TR, and the echo is filled into k-space as a spoke, the time interval of the auxiliary lines obtained according to FIG. 8 may be TR*n (the number (or count) of slices $P_1$-$P_n$). Therefore, the auxiliary signals, including multiple auxiliary subsets, selected from the imaging signals may be with a time resolution, which can be used for temporal information determination in multitasking reconstruction. Compared with the case in which auxiliary signals are collected by additionally sampling the k-space center line repeatedly with a sampling frequency, the time interval of the auxiliary subsets may correspond to the sampling frequency.

In some embodiments, the time interval of the auxiliary subsets may be shorter than an interval threshold, so that the auxiliary signals is with a high-temporal resolution. The interval threshold may be a default value, or determined manual by a user, or determined by the processing device 120 according to data analysis. For example, the interval threshold may be determined according to the at least one time-varying dimension to be analyzed. Merely by way of example, a time-varying dimension may relate to the respiratory motion of the subject, and the respiration cycle of the subject is close to 0.75 seconds (s). In order to capture dynamic information relating to the respiratory motion of the subject, the time interval of the auxiliary lines may need to be shorter than an interval threshold of 0.75 s. As another example, the interval threshold may be determined according to actual requirements (e.g., the accuracy requirement), experience, a data model, etc.

In some embodiments, the time interval of the auxiliary subsets may be determined by adjusting the acquisition of the imaging signals, e.g., the length of TR, the number (or count) of echoes sampled in a TR, the number (or count) of slices of k-space (the number of phase encoding steps along the slice selection direction), or the like, or any combination thereof.

It should be noted that the above description is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure.

Figure 9:
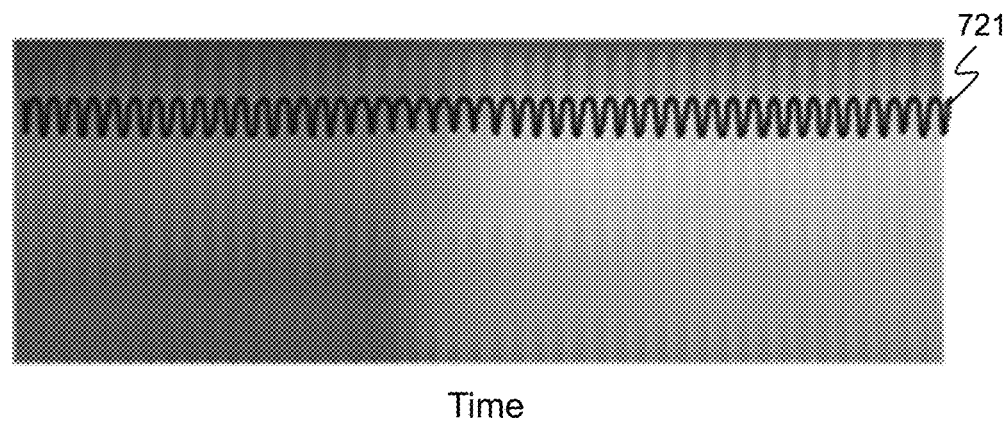
FIG. 9 is a schematic diagram of respiratory motion and signal intensity variation related to contrast agent according to some embodiments of the present disclosure.
Figure 10A:
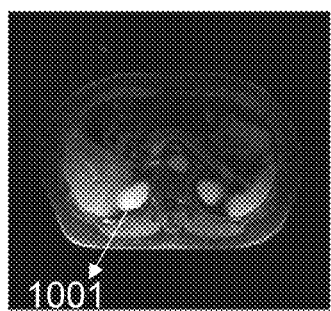
FIGS. 10A-10F are schematic diagrams of exemplary target images according to some embodiments of the present disclosure.
Figure 10B:
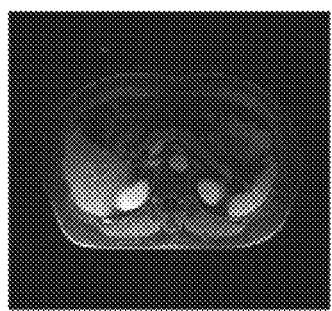
Figure 10C:
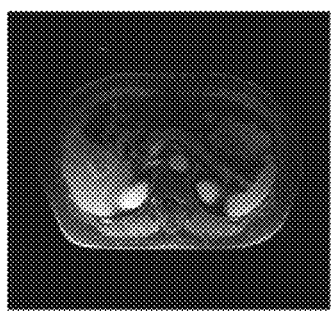
Figure 10D:
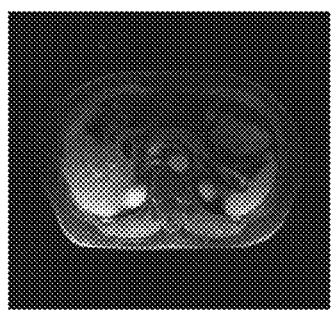
Figure 10E:
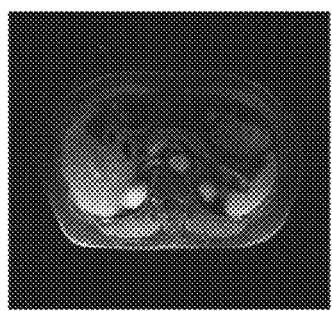
Figure 10F:
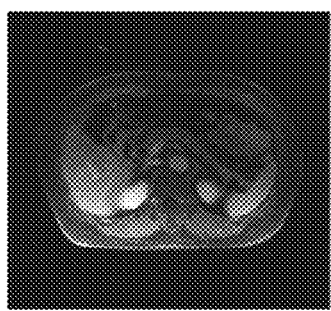
Figure 11A:
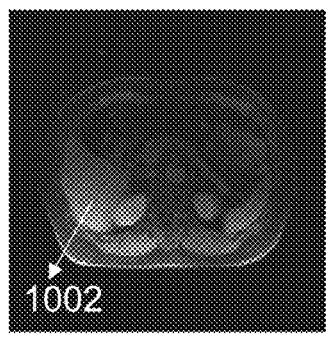
FIGS. 11A-11F are schematic diagrams of exemplary target images according to some embodiments of the present disclosure.
Figure 11B:
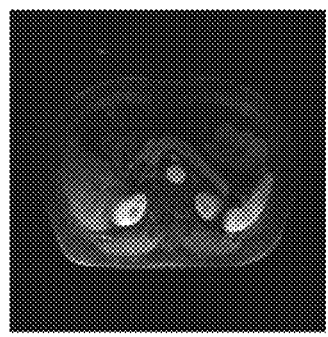
Figure 11C:
Figure 11D:
Figure 11E:
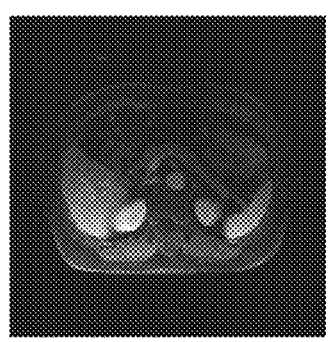
Figure 11F:
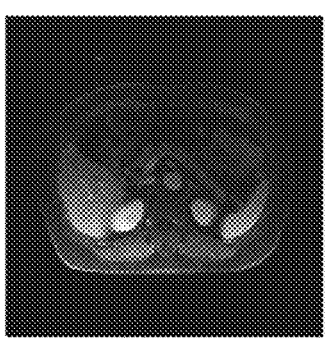

FIG. 9 is a schematic diagram of respiratory motion and signal intensity variation related to contrast agent according to some embodiments of the present disclosure.

For example, in multitasking imaging of abdominal dynamic contrast enhanced (DCE) for free breathing, there are two temporal dimensions, respiratory motion and contrast agent dynamic.

As shown in FIG. 9, the horizontal axis represents time. In FIG. 9, the depth of color indicates the MR signal intensity affected by the contrast agent. The deeper the color is, the stronger the MR signal intensity is. The curve 901 represents the motion curve of abdomen over time caused by the respiratory motion, indicating the motion range of abdomen.

Assuming that the respiration cycle is about 0.75s, the time interval of the auxiliary subsets obtained according to the process 600 can reach about 200-300 milliseconds, which is enough to capture the changes in respiratory motion and the contrast agent dynamic over time.

FIGS. 10A-10F are schematic diagrams of exemplary target images according to some embodiments of the present disclosure.

In some embodiments, the processing device 120 may use operation 620 of the process 600 to extract a portion of the imaging signals as auxiliary signals, and then use the multitasking technique to reconstruct the imaging signals and the auxiliary signals to obtain real-time target images with high time resolution, e.g., the target images in FIGS. 10A-10F. As shown in FIGS. 10A-10F, each target image may correspond to an acquisition time of 0.1 s. A user (e.g., a doctor, a technician, etc.) can observe the changes in the shape of an organ due to physical motion (e.g., respiratory motion, cardiac motion) through the real time images. For example, a user (e.g., a doctor, a technician, etc.) can observe the changes in the shape of the kidney 1001 due to respiratory motion through the target images in FIGS. 10A-10F. For example, in image-guided radiotherapy, high-resolution real-time imaging results can be generated, and the doctor can observe the morphological changes of the treated organ or surrounding normal organs with the radiotherapy process, and then adjust the radiotherapy plan.

FIGS. 11A-11F are schematic diagrams of exemplary target images according to some embodiments of the present disclosure.

In some embodiments, the processing device 120 may fill the real-time images (e.g., the images in FIGS. 10A-10F) into a matrix according to at least one temporal dimension, e.g., two dimensions of the respiratory phase and the contrast agent dynamic (e.g., the changes of MR signal intensity affected by the contrast agent). The processing device 120 may process the matrix, such as perform interpolation, filling, etc., and then select images corresponding to a respiration phase, e.g., the images in FIGS. 11A-11F.

As shown in FIGS. 11A-11F, the images correspond to the same respiratory phase. Each image corresponds to an acquisition time of 5 seconds. After the respiratory phase is fixed, the changes of the MR signal intensity affected by contrast agent over time may be reflected in the images of FIGS. 11A-11F. For example, in FIGS. 11A-11F, different brightness of the liver 1002 reflects changes of MR signal intensities over time, and further reflects changes in contrast agent concentration over time.

It should be noted that the above description is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure.

In some embodiments, the processing device 120 may determine temporal information using another method without additional sampling k-space.

In some embodiments, the processing device 120 may extract a portion of the plurality of imaging signals. The processing device 120 may determine a plurality of reference images based on the portion of the plurality of imaging signals of which frequencies meet specific requirements, or of which spatial positions in the k-space meet specific requirements, or that are determined based on other algorithm rules.

In some embodiments, the reference images may be reconstructed based on a portion of the plurality of imaging signals of which the frequencies are lower than a frequency threshold. The frequency threshold may be determined according to actual needs or experience, for example, 120 Hz or 130 Hz, as another example, 0.08 Hz or 0.09 Hz. In some embodiments, the frequency threshold may be determined according to the magnetic resonance frequency range corresponding to the scanned object. For example, the threshold corresponding to the low frequency part of the frequency range may be determined as the frequency threshold.

In some embodiments, the reference images may be reconstructed based on a portion of the plurality of imaging signals located in the central area of the k-space. The central area may be determined according to actual needs or experience. For example, taking the center point of k-space as the origin, and the spatial region where the value corresponding to the frequency in the space coordinate is from 0 to 120 Hz is the central region. It can be understood that the frequency corresponding to the central area of the k-space is lower than the frequency threshold.

In some embodiments, the portion of the plurality of imaging signals may be acquired corresponding to multiple times. A reference image may be reconstructed based on the portion of the plurality of imaging signals corresponding to one time.

In some embodiments, the imaging signals may be acquired based on a plurality of spiral trajectories with a reduced density from the center to the outside in the k-space, that is, the k-space data track density in the center of the k-space is greater than the k-space data track density in the surrounding part of the k-space.

In some embodiments, among the plurality of spiral trajectories, at least two spiral trajectories corresponding to adjacent times have a rotation angle.

In some embodiments, the processing device 120 may determine an image representation matrix based on the multiple reference images and the multiple time sequences corresponding to the multiple reference images. The image representation matrix may include a space dimension and a time dimension. The space dimension may correspond to the spatial position in the reference images, and the time dimension may represent the multiple times corresponding to the multiple reference images.

In some embodiments, a reference image may be expressed as a vector, and based on the time sequence of multiple times corresponding to multiple reference images, multiple vectors corresponding to multiple reference images may be sequentially arranged to obtain the corresponding image representation matrix.

In some embodiments, a reference image may be represented as a row vector, and multiple row vectors corresponding to the multiple reference images may be arranged in a sequence based on a time sequence along the column direction to obtain an image representation matrix. In some embodiments, a reference image may be represented as a column vector, and multiple column vectors corresponding to the multiple reference images may be sequentially arranged along the row direction based on a time sequence to obtain an image representation matrix.

For a reference image, it may include m*n pixels, and m and n are integers. Each pixel includes pixel information (for example, the spatial location of the pixel, pixel value, etc.). In some embodiments, the reference image including m*n pixels may be represented as a vector including m*n elements, and each element in the vector may correspond to the pixel information of one pixel (such as the spatial position of the pixel). In the image representation matrix, the spatial position information (such as the spatial position of a pixel) and time information (such as the scanning time corresponding to the multiple reference images) of multiple reference images may be included.

It can be understood that based on the arrangement of the vector representation and the image representation matrix corresponding to the reference image, the row dimension and column dimension of the image matrix correspond to the space dimension and time dimension of the multiple reference images, respectively. The spatial dimension corresponds to the spatial position information in the reference image, and the time dimension represents the time information of multiple reference images, that is, multiple times corresponding to the multiple reference images.

In some embodiments, the processing device 120 may determine the time information based on the image representation matrix and the time dimension.

As mentioned above, the image representation matrix may include spatial information (such as the spatial position of a pixel) and time information (such as multiple times corresponding to the multiple reference images) of multiple reference images. The row dimension and column dimension of the image matrix correspond to the space dimension and time dimension of multiple reference images, respectively.

In some embodiments, the image representation matrix can be matrix decomposed to obtain the first matrix corresponding to the time dimension (that is, the matrix representing the time information of the reference images) and the second matrix corresponding to the space dimension (that is, the reference images matrix of spatial information). In some embodiments, the first matrix obtained by decomposition (that is, the matrix representing the time information of the reference images) may include the time information of multiple reference images (such as multiple times corresponding to the multiple reference images), and the second matrix (that is, representing the matrix of reference image spatial information) may include spatial information of multiple reference images (such as the spatial positions of pixels in the reference images).

In some embodiments, the time information of the dynamic image may be determined based on the first matrix. In some embodiments, the time information basis of the dynamic image may be determined based on the first matrix, and the time information basis of the dynamic image can be used as the time information of the dynamic image.

In some embodiments, the rank of the first matrix may be determined, and a part of the first matrix may be determined based on the rank of the first matrix as a representation of the temporal basis of the dynamic image. In some embodiments, the rank of the matrix may be obtained by solving the matrix. For example, the elementary transformation method, Gaussian elimination method and other algorithms are used to obtain the rank of the matrix. In some embodiments, the rank of the matrix corresponds to a value range, which can be set according to experience or actual needs. For example, the value range may be 10-40. Take the rank of 20 as an example, that is, the first 20 columns of the second matrix are used as the representation of the time basis of the dynamic image. It can be understood that the rank of the matrix is smaller than the column dimension of the matrix. In some embodiments, the rank of the matrix is related to the temporal correlation or similarity between multiple reference images.

In some embodiments, the matrix decomposition of the image representation matrix may adopt a manner of performing singular value decomposition on the image representation matrix based on the time dimension to determine the time information of the dynamic image. For example, by performing singular value decomposition, the image representation matrix may be represented based on an orthogonal matrix corresponding to the row dimension, an orthogonal matrix corresponding to the column dimension, and a diagonal matrix. The orthogonal matrix corresponding to the time dimension obtained by decomposition may be used as the first matrix corresponding to the time dimension (that is, the matrix representing time information).

Compared with the above process, in the process 600, the auxiliary signals extracted from the imaging signals approximate the data acquired by repeatedly sampling the same k-space subset, and can be used to directly determine the temporal information, without the operation of generating the reference images. In some embodiments, the processing device 120 may obtain imaging signals related to a region of interest (ROI) of a subject (e.g., as illustrated in operation 610 of the process 600 in FIG. 6). The processing device 120 may select a portion of the imaging signals as auxiliary signals associated with at least one temporal dimension of the ROI (e.g., as illustrated in operation 620 of the process 600 in FIG. 6). The processing device 120 may generate at least one target image associated with the at least one temporal dimension of the ROI based on the imaging signals and the auxiliary signals.

The auxiliary signals selected from the imaging signals may include a plurality of auxiliary subsets each of which corresponds to the same region (the same subset) of k-space. The plurality of auxiliary subsets of the auxiliary signals may have a temporal resolution so that the auxiliary signals can reflect MR signal changes of the ROI in at least one temporal dimension, thereby the auxiliary signals being able to be used to generate at least one MR image of the at least one temporal dimension. The auxiliary signals are obtained from the imaging signals, instead of using additional k-space sampling in addition to the acquisition of the imaging signals, which reduces the imaging time.

For purpose of illustration, as described above, multitasking reconstruction using the auxiliary signals may be taken as an example. It should be noted that for persons having ordinary skills in the art, the auxiliary signals described in the present disclosure may be applied to other similar situations, such as other MR reconstruction algorithm for generating at least one MR image of at least one temporal dimension.

Having thus described the basic concepts, it may be rather apparent to those skilled in the art after reading this detailed disclosure that the foregoing detailed disclosure is intended to be presented by way of example only and is not limiting. Various alterations, improvements, and modifications may occur and are intended to those skilled in the art, though not expressly stated herein. These alterations, improvements, and modifications are intended to be suggested by this disclosure, and are within the spirit and scope of the exemplary embodiments of this disclosure.

Moreover, certain terminology has been used to describe embodiments of the present disclosure. For example, the terms "one embodiment," "an embodiment," and "some embodiments" mean that a particular feature, structure or characteristic described in connection with the embodiment is included in at least one embodiment of the present disclosure. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the present disclosure.

Further, it will be appreciated by one skilled in the art, aspects of the present disclosure may be illustrated and described herein in any of a number of patentable classes or context including any new and useful process, machine, manufacture, or composition of matter, or any new and useful improvement thereof. Accordingly, aspects of the present disclosure may be implemented entirely hardware, entirely software (including firmware, resident software, micro-code, etc.) or combining software and hardware implementation that may all generally be referred to herein as a "module," "unit," "component," "device," or "system." Furthermore, aspects of the present disclosure may take the form of a computer program product embodied in one or more computer readable media having computer readable program code embodied thereon.

A computer readable signal medium may include a propagated data signal with computer readable program code embodied therein, for example, in baseband or as part of a carrier wave. Such a propagated signal may take any of a variety of forms, including electro-magnetic, optical, or the like, or any suitable combination thereof. A computer readable signal medium may be any computer readable medium that is not a computer readable storage medium and that may communicate, propagate, or transport a program for use by or in connection with an instruction execution system, apparatus, or device. Program code embodied on a computer readable signal medium may be transmitted using any appropriate medium, including wireless, wireline, optical fiber cable, RF, or the like, or any suitable combination of the foregoing.

Computer program code for carrying out operations for aspects of the present disclosure may be written in any combination of one or more programming languages, including an object oriented programming language such as Java, Scala, Smalltalk, Eiffel, JADE, Emerald, C++, C #, VB. NET, Python or the like, conventional procedural programming languages, such as the "C" programming language, Visual Basic, Fortran 2003, Perl, COBOL 2002, PHP, ABAP, dynamic programming languages such as Python, Ruby and Groovy, or other programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider) or in a cloud computing environment or offered as a service such as a Software as a Service (SaaS).

Furthermore, the recited order of processing elements or sequences, or the use of numbers, letters, or other designations therefore, is not intended to limit the claimed processes and methods to any order except as may be specified in the claims. Although the above disclosure discusses through various examples what is currently considered to be a variety of useful embodiments of the disclosure, it is to be understood that such detail is solely for that purpose, and that the appended claims are not limited to the disclosed embodiments, but, on the contrary, are intended to cover modifications and equivalent arrangements that are within the spirit and scope of the disclosed embodiments. For example, although the implementation of various components described above may be embodied in a hardware device, it may also be implemented as a software only solution, e.g., an installation on an existing server or mobile device.

Similarly, it should be appreciated that in the foregoing description of embodiments of the present disclosure, various features are sometimes grouped together in a single embodiment, figure, or description thereof for the purpose of streamlining the disclosure aiding in the understanding of one or more of the various embodiments. This method of disclosure, however, is not to be interpreted as reflecting an intention that the claimed subject matter requires more features than are expressly recited in each claim. Rather, claim subject matter lie in less than all features of a single foregoing disclosed embodiment.

What is claimed is:

1. A method for magnetic resonance imaging (MRI) implemented on a machine having at least one processing device and at least one storage device, the method comprising:
    obtaining imaging signals related to a region of interest (ROI) of a subject;
    selecting a portion of the imaging signals as auxiliary signals associated with at least one temporal dimension of the ROI; and
    generating at least one target image associated with the at least one temporal dimension of the ROI based on the imaging signals and the auxiliary signals.

2. The method of claim 1, wherein the auxiliary signals includes the portion of the imaging signals sampled in a central region of k-space.

3. The method of claim 2, wherein the central region of k-space includes a k-space center line along a slice selection direction of k-space.

4. The method of claim 2, wherein the imaging signals are acquired based on a plurality of k-space trajectories each of which passes through the central region.

5. The method of claim 4, wherein selecting the portion of the imaging signals as the auxiliary signals associated with the ROI includes:
    obtaining a plurality of data sets each of which includes a portion of the plurality of k-space trajectories;
    in each of the plurality of data sets, selecting, as an auxiliary subset, the imaging signals sampled in the central region; and
    designating the plurality of auxiliary subsets as the auxiliary signals.

6. The method of claim 5, wherein the k-space trajectories in each of the plurality of data sets are sampled successively, and for each of the plurality of data sets, the selected imaging signals in the corresponding auxiliary subset are sampled at different locations in the central region.

7. The method of claim 5, wherein the imaging signals are acquired in a plurality of parallel slices of k-space arranged along a slice-selective direction of k-space.

8. The method of claim 7, wherein the k-space trajectories in each of the plurality of data sets are radial trajectories that are from the plurality of parallel slices and corresponding to a same angle.

9. The method of claim 1, wherein generating the at least one target image associated with the at least one temporal dimension of the ROI based on the imaging signals and the auxiliary signals includes:
    determining, based on the auxiliary signals, temporal information relating to the at least one temporal dimension of the ROI;
    determining, based on the temporal information and the imaging signals, spatial information relating to at least one spatial dimension of the ROI; and
    generating the at least one target image of the ROI based on the temporal information and the spatial information.

10. A system for magnetic resonance imaging (MRI) comprising:
    at least one storage device including a set of instructions; and
    at least one processor in communication with the at least one storage device, wherein when executing the set of instructions, the at least one processor is directed to perform operations including:
        obtaining imaging signals related to a region of interest (ROI) of a subject;
        selecting a portion of the imaging signals as auxiliary signals associated with at least one temporal dimension of the ROI; and
        generating at least one target image associated with the at least one temporal dimension of the ROI based on the imaging signals and the auxiliary signals.

11. The system of claim 10, wherein the auxiliary signals includes the portion of the imaging signals sampled in a central region of k-space.

12. The system of claim 11, wherein the central region of k-space includes a k-space center line along a slice selection direction of k-space.

13. The system of claim 11, wherein the imaging signals are acquired based on a plurality of k-space trajectories each of which passes through the central region.

14. The system of claim 13, wherein selecting the portion of the imaging signals as the auxiliary signals associated with the ROI includes:
    obtaining a plurality of data sets each of which includes a portion of the plurality of k-space trajectories;

in each of the plurality of data sets, selecting, as an auxiliary subset, the imaging signals sampled in the central region; and designating the plurality of auxiliary subsets as the auxiliary signals.

15. The system of claim 14, wherein the k-space trajectories in each of the plurality of data sets are sampled successively.

16. The system of claim 14, wherein for each of the plurality of data sets, the selected imaging signals in the corresponding auxiliary subset are sampled at different locations in the central region.

17. The system of claim 14, wherein the imaging signals are acquired in a plurality of parallel slices of k-space arranged along a slice-selective direction of k-space.

18. The system of claim 17, wherein the k-space trajectories in each of the plurality of data sets are radial trajectories that are from the plurality of parallel slices and corresponding to a same angle.

19. The system of claim 10, wherein generating the at least one target image associated with the at least one temporal dimension of the ROI based on the imaging signals and the auxiliary signals includes:

determining, based on the auxiliary signals, temporal information relating to the at least one temporal dimension of the ROI;

determining, based on the temporal information and the imaging signals, spatial information relating to at least one spatial dimension of the ROI; and generating the at least one target image of the ROI based on the temporal information and the spatial information.

20. A non-transitory computer readable medium, comprising at least one set of instructions, wherein when executed by one or more processors of a computing device, the at least one set of instructions causes the computing device to perform a method, the method comprising:

obtaining imaging signals related to a region of interest (ROI) of a subject;

selecting a portion of the imaging signals as auxiliary signals associated with at least one temporal dimension of the ROI; and generating at least one target image associated with the at least one temporal dimension of the ROI based on the imaging signals and the auxiliary signals.

* * * * *